US009847326B2

(12) United States Patent
Tegen et al.

(10) Patent No.: US 9,847,326 B2
(45) Date of Patent: Dec. 19, 2017

(54) ELECTRONIC STRUCTURE, A BATTERY STRUCTURE, AND A METHOD FOR MANUFACTURING AN ELECTRONIC STRUCTURE

(71) Applicant: Infineon Technologies AG, Neubiberg (DE)

(72) Inventors: Stefan Tegen, Dresden (DE); Marko Lemke, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/037,429

(22) Filed: Sep. 26, 2013

(65) Prior Publication Data

US 2015/0084157 A1 Mar. 26, 2015

(51) Int. Cl.
| | |
|---|---|
| *H01L 27/01* | (2006.01) |
| *H01L 21/822* | (2006.01) |
| *H01M 6/40* | (2006.01) |
| *H01M 10/04* | (2006.01) |
| *H01M 10/42* | (2006.01) |
| *H01L 49/02* | (2006.01) |
| *H01G 4/33* | (2006.01) |

(Continued)

(52) U.S. Cl.
CPC .......... *H01L 27/016* (2013.01); *H01L 21/822* (2013.01); *H01L 28/90* (2013.01); *H01M 6/40* (2013.01); *H01M 10/0436* (2013.01); *H01M 10/4257* (2013.01); *H01G 4/33* (2013.01); *H01G 4/40* (2013.01); *H01G 11/08* (2013.01); *H01L 28/00* (2013.01); *H01L 2224/04105* (2013.01); *H01L 2224/24195* (2013.01); *H01L 2924/12044* (2013.01)

(58) Field of Classification Search
CPC ......... H01L 21/822; H01L 2224/04105; H01L 2224/24195; H01L 27/016; H01L 28/00; H01L 28/90; H01L 2924/12044; H01L 2924/00; H01M 2/204; H01M 2/24; H01M 2/34; H01M 10/02; H01M 4/767; H01M 10/04; H01M 10/42; H01M 10/0436; H01M 10/4257; H01M 6/40; H01G 11/08; H01G 4/33; H01G 4/40
USPC ....................................... 257/528
See application file for complete search history.

(56) References Cited

U.S. PATENT DOCUMENTS

| | | | |
|---|---|---|---|
| 5,499,030 A | 3/1996 | Wicks et al. | |
| 6,495,283 B1 * | 12/2002 | Yoon ...................... | H01M 6/18 29/623.5 |

(Continued)

FOREIGN PATENT DOCUMENTS

| | | |
|---|---|---|
| CN | 1856883 A | 11/2006 |
| CN | 102210023 A | 10/2011 |

(Continued)

OTHER PUBLICATIONS

Zeghbroech, "Principles of Semiconductor Devices, Chapter 6: MOS Capacitors", 2011, 3 pages.

*Primary Examiner* — Vongsavanh Sengdara
(74) *Attorney, Agent, or Firm* — Viering, Jentschura & Partner mbB

(57) ABSTRACT

According to various embodiments, an electronic structure may be provided, the electronic structure may include: a semiconductor carrier, and a battery structure monolithically integrated with the semiconductor carrier, the battery structure including a plurality of thin film batteries.

20 Claims, 20 Drawing Sheets

(51) Int. Cl.
*H01G 4/40* (2006.01)
*H01G 11/08* (2013.01)

(56) References Cited

U.S. PATENT DOCUMENTS

| | | | |
|---|---|---|---|
| 8,829,329 B2* | 9/2014 | Deligianni | H01L 31/02245 136/244 |
| 8,932,947 B1 | 1/2015 | Han et al. | |
| 9,024,809 B2 | 5/2015 | Testar | |
| 2002/0092558 A1* | 7/2002 | Kim | H01M 14/005 136/244 |
| 2005/0156780 A1 | 7/2005 | Bonthron et al. | |
| 2006/0137737 A1 | 6/2006 | Nakayama et al. | |
| 2007/0275300 A1 | 11/2007 | Salot et al. | |
| 2008/0032236 A1* | 2/2008 | Wallace | H01M 6/40 430/319 |
| 2008/0050656 A1* | 2/2008 | Eisenbeiser | H01M 2/0267 429/241 |
| 2010/0136245 A1* | 6/2010 | Albano | H01M 4/0421 427/446 |
| 2011/0123852 A1* | 5/2011 | Srinivasan | H01M 10/04 429/162 |
| 2011/0163909 A1 | 7/2011 | Jeong | |
| 2011/0183186 A1* | 7/2011 | Klootwijk | H01M 2/1061 429/160 |
| 2012/0043814 A1 | 2/2012 | Deligianni et al. | |
| 2012/0235854 A1 | 9/2012 | Testar | |
| 2013/0084476 A1* | 4/2013 | Ellis-Monaghan | H01M 2/204 429/61 |
| 2013/0320455 A1 | 12/2013 | Cappellani et al. | |
| 2013/0329373 A1* | 12/2013 | Smith | H01L 23/13 361/728 |
| 2014/0038028 A1 | 2/2014 | Genard | |
| 2014/0233200 A1 | 8/2014 | Lemke et al. | |

FOREIGN PATENT DOCUMENTS

| | | |
|---|---|---|
| CN | 102680967 A | 9/2012 |
| CN | 102707285 A | 10/2012 |
| CN | 103069580 A | 4/2013 |
| DE | 102014101058 A1 | 8/2014 |
| WO | 2010054209 A1 | 5/2010 |

* cited by examiner

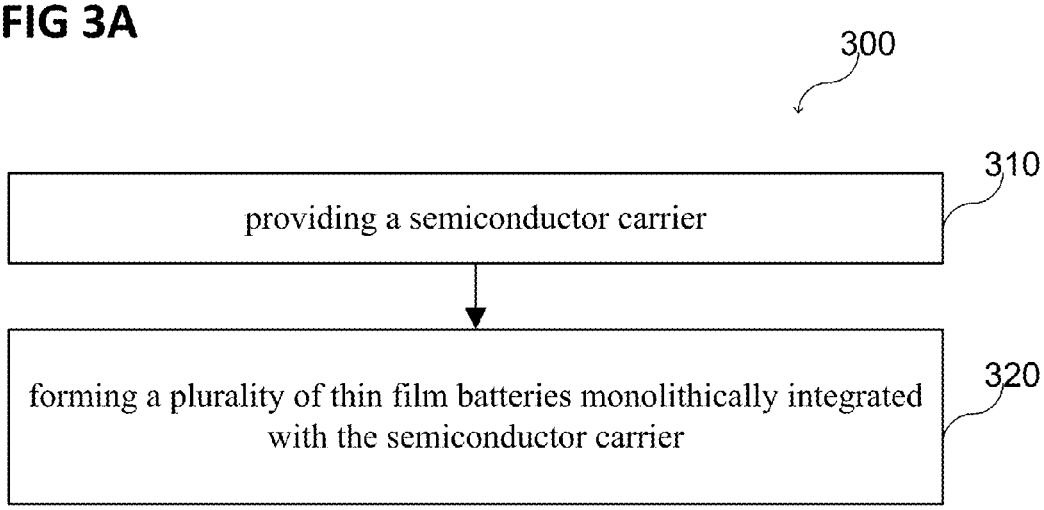
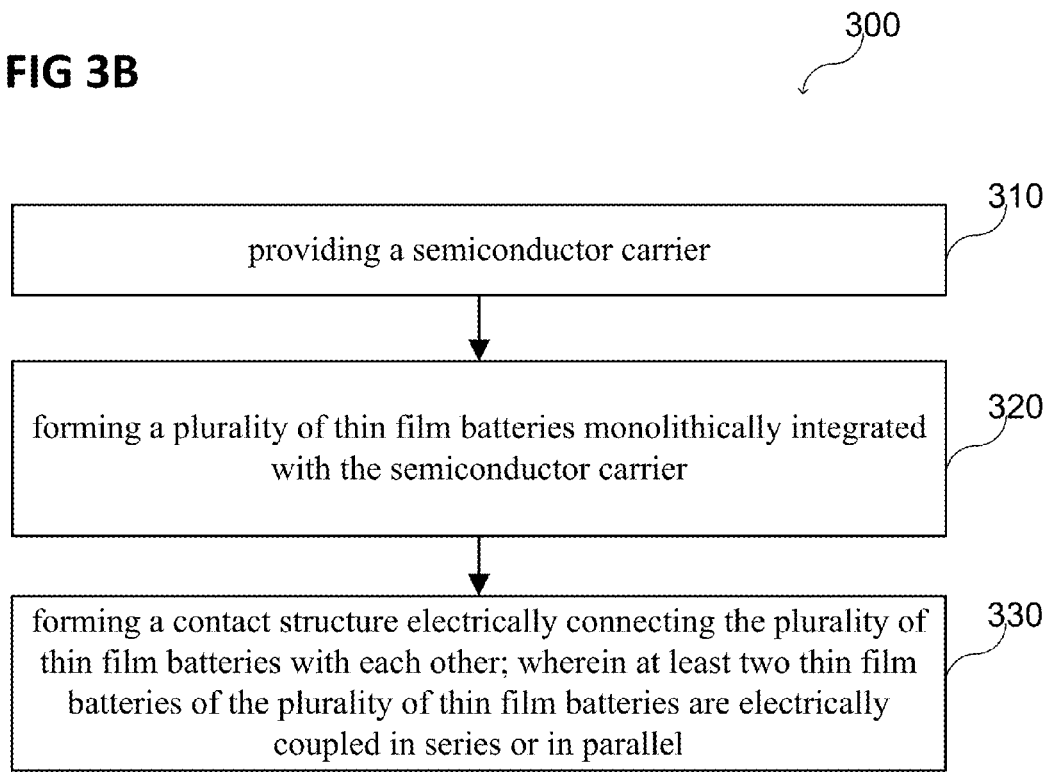

ELECTRONIC STRUCTURE, A BATTERY STRUCTURE, AND A METHOD FOR MANUFACTURING AN ELECTRONIC STRUCTURE

TECHNICAL FIELD

Various embodiments relate generally to an electronic structure, a battery structure, and a method for manufacturing an electronic structure.

BACKGROUND

In semiconductor industry a variety of processes may be utilized for manufacturing electronic devices, such as integrated circuits, memory chips, sensors, and the like. Furthermore, it may be desirable to develop fabrication processes for batteries, e.g. thin film batteries, using similar fabrication techniques as they are used in semiconductor industry. Commonly used thin film deposition techniques may allow the fabrication of functional layers forming a battery, or forming a rechargeable battery in thin film technology. Typically, a thin film battery may include a solid state electrolyte to be processable in semiconductor thin film technology.

SUMMARY

According to various embodiments, an electronic structure may be provided, the electronic structure may include: a semiconductor carrier, and a plurality of thin film batteries being monolithically integrated with the semiconductor carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A and 3B show respectively a method for manufacturing an electronic structure in a schematic process flow diagram, according to various embodiments;

DESCRIPTION

Figure 1A:
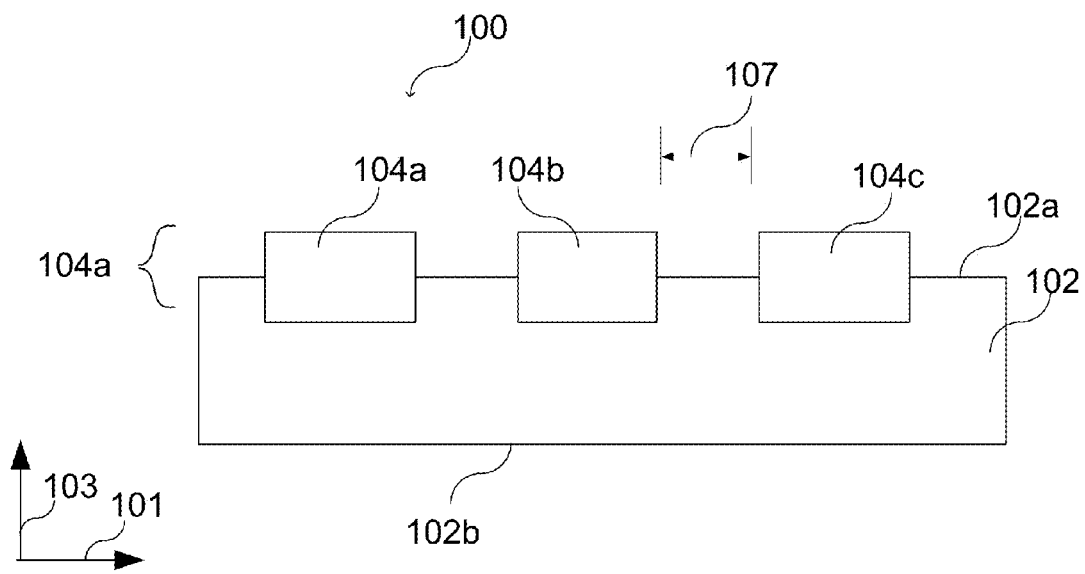
FIGS. 1A to 1F show respectively an electronic structure or a battery structure in a schematic cross sectional view or side view, according to various embodiments.

The following detailed description refers to the accompanying drawings that show, by way of illustration, specific details and embodiments in which the invention may be practiced.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

The term "lateral" used with regards to the "lateral" extension of a structure (or of a carrier) or "laterally" displaced, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element, e.g. a cavity) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). Further, the term "depth" used with regards to a depth of a cavity (or of a hole), may be used herein to mean an extension of a cavity along a direction perpendicular to the surface of a carrier (e.g. perpendicular to the main processing surface of a carrier).

The word "cover" used with regards to deposited material covering a structure (or a structure element, or a sidewall), may be used herein to mean that a deposited material may cover a structure (or a structure element, or a sidewall) completely, e.g. covering all exposed sides and surfaces of a structure. The word "cover" used with regards to deposited material covering a structure (or a structure element, or a sidewall), may be used herein to mean that the deposited material may cover a structure at least partially, e.g. a material may at least partially cover the exposed sides and surfaces of a structure.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

Since there may be many individual processes used in semiconductor processing (e.g. during the manufacture of a battery structure or an electronic structure, e.g. during processing a carrier or a wafer including a battery structure or an electronic structure), usually carried out in sequence, several basic manufacturing techniques may be used at least once in the overall manufacturing process. The following description of basic techniques should be understood as illustrating examples, which techniques may be included in the processes described herein. The exemplarily described basic techniques may be not necessarily need to be construed as preferred or advantageous over other techniques or methods, since they may serve to illustrate how one or more embodiments of the invention may be practiced. For sake of brevity, the illustration of exemplarily described basic techniques may be only a short overview and should not be considered as exhaustive specification.

According to various embodiments, at least one of the following techniques may be used for manufacturing an electronic structure or a battery structure, as described herein. According to various embodiments, at least one of the techniques, as described in the following, may be included in a method for manufacturing an electronic structure or in a method for manufacturing a battery structure, or e.g. in a method for manufacturing a battery structure including an integrated circuit to control the battery structure, as described herein.

According to various embodiments, at least one layering (or layering process) may be used in for manufacturing an electronic structure or a battery structure, as described herein. In a layering process, a layer (also generally referred to as film or thin film) may be deposited over a surface (e.g. over a carrier, over a wafer, over a substrate, over another layer, over a plurality of structure elements, and the like) using deposition techniques which may include chemical vapor deposition (CVD, or a CVD process) and/or physical vapor deposition (PVD, or a PVD process), according to various embodiments. The thickness of a deposited layer may be in the range from a few nanometers up to several micrometers depending on its specific function. The thickness of a deposited layer may be regarded as the spatial extension of the deposited layer along its growth direction. Thin layers in the range of a few nanometers, e.g. having a layer thickness smaller than 50 nm, may be formed using an atomic layer deposition (ALD). A conformal layer, e.g. covering the sidewalls of a structure element or covering the inner sidewalls of a cavity, may be formed using an atomic layer deposition (ALD) or another suitable conformal deposition process, as for example low pressure chemical vapor deposition (LPCVD).

According to various embodiments, a deposited (formed or provided) layer may include at least one of an electrically insulating material, an electrically semiconducting material, and/or an electrically conductive material, depending on the respective specific function of the deposited layer. According to various embodiments, electrically conductive materials, as for example aluminium, aluminium-silicon alloys, aluminium-copper alloys, copper, nichrome (an alloy of nickel, chromium, and/or iron), tungsten, titanium, titanium nitride, molybdenum, platinum, gold, carbon (graphite), or the like, may be deposited using a CVD process or a PVD process. According to various embodiments, semiconducting materials, as for example silicon (e.g. silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using a CVD process. Insulating materials, as for example silicon oxide, silicon nitride, silicon oxynitride, metal oxides (e.g. aluminum oxide), organic compounds, polymers, (or the like) may be deposited using a CVD process or a PVD process. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, silicon, polysilicon, amorphous silicon, silicon dioxide, silicon nitride, and the like may be deposited using LPCVD or ALCVD. According to various embodiments, for example platinum, titanium nitride, titanium oxide, UPON, LLT, LTO, copper nitride, vanadium oxide, LiFePO$_4$, and LiCoO$_x$ may be deposited using atomic layer deposition (ALD or ALCVD).

According to various embodiments, a physical vapor deposition process may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may further include thermal oxidation (also referred to as thermal oxidation process). According to various embodiments, thermal oxidation may be used to grow high quality silicon oxide layers (so-called high temperature oxide layer (HTO)) on a silicon surface, e.g. at a temperatures in the range from about 800° C. to about 1200° C. The thermal oxidation may be performed at atmospheric pressure or at high pressure and as further modification as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

Further, according to various embodiments, a process which may be applied to generate a metal layer may be plating, e.g. electroplating or electroless plating. Electrically conductive materials like gold, silver, palladium, nickel, aluminum, copper and/or compounds like nickel-phosphorous, may be deposited using a plating process According to various embodiments, a plating process may be used for forming a metallization layer structure or a metallization. According to various embodiments, a metallization layer may include for example one or more metal lines and one or more vias connecting several structures or structure elements on a carrier, e.g. connecting a plurality of battery structures with each other, e.g. connecting a plurality of batteries or a plurality of battery structures with an integrated circuit. Further, a metallization may include a dielectric structure or a patterned dielectric layer, wherein the wiring may be embedded in the dielectric structure or in the dielectric layer.

Referring to this, at least one metallization process may be applied for manufacturing a contact structure of an electronic structure or of a battery structure, or e.g. for manufacturing an electronic structure or a battery structure. A metallization may be in direct contact with at least one structure element of an electronic structure or of a battery structure (or with at least one structure on a carrier, e.g. with a thin film battery or with an integrated circuit). Therefore, a metallization process may be used to provide required electrical connections (or interconnections) of an electronic structure or of a battery structure on a wafer. A metallization process may include at least one layering process and at least one patterning process. A metallization process may include depositing a layer of a dielectric material (e.g. a low-k dielectric material, e.g. undoped silicate glass, and the like), forming contact holes at the desired locations (e.g. using at least one patterning process), and filling the contact holes with at least one electrically conductive material (e.g. with at least one of a metal (e.g. aluminium, copper, tungsten, titanium, molybdenum, gold, platinum, and the like), a metallic material (e.g. titanium nitride, platinum silicide, titanium silicide, tungsten silicide, molybdenum silicide, and the like), electrically conductive polysilicon, and a metal alloy (e.g. aluminium-silicon alloys, aluminium-copper alloys, aluminium-silicon-copper alloys, nichrome, titanium-tungsten alloys, and the like)) using a layering process. Further, a metallization process (or a metallization process) may include forming additional layers for example as a bather (e.g. including at least one of molybdenum, a transition metal nitride (e.g. titanium nitride), platinum silicide, titanium silicide, tungsten silicide, molybdenum silicide, borides, tantalum, tungsten, and the like), or as adhesion promoter (e.g. including at least one of platinum silicide, titanium silicide, tungsten silicide, molybdenum silicide, and the like). Further, a dielectric layer may include a layer stack, e.g. one or more layer being disposed over each other, including for example silicon oxide, silicon nitride, and/or silicon oxynitride. A dielectric layer silicon oxide, silicon nitride, and/or silicon oxynitride may be used as a final dielectric layer or a final passivation layer on the top of the metallization. Further, an inter-level dielectric or inter-layer dielectric (ILD), may be used to electrically separate the components of a wiring structure (e.g. interconnect lines, contact pads, and the like) being arranged in several levels of a multilevel metallization or being arrange in a metallization layer of a multilevel metallization. The ILD may include low-k dielectric material (e.g. silicon oxide, porous silicon, and the like) to reduce the electrical coupling between adjacent components of the wiring structure.

The term "dielectric" as used herein referring to a dielectric material, a dielectric layer, a dielectric structure, and the like, may be used herein to mean an electrically insulating material in general. Further the term "dielectric" may refer to a so-called low-κ material, as typically used in metallization structures in any semiconductor technology. According to various embodiments, at least one of the following materials may be used to provide a dielectric layer or a dielectric structure: silicon oxide (dielectric constant of 3.9) and a material having a smaller a dielectric constant then silicon oxide, e.g. fluorine-doped silicon dioxide, fluorosilicate glass, carbon-doped silicon dioxide, porous silicon dioxide, porous carbon-doped silicon dioxide, organic dielectrics, dielectric polymers, silicone based polymeric dielectrics, polynorbomenes, benzocyclobutene, polytetrafluoroethylene, resins, hydrogen silsesquioxane (HSQ), methylsilsesquioxane (MSQ) and the like.

According to various embodiments, applying a metallization process may further include a planarization of a carrier surface (wafer surface, substrate surface, and the like) and/or a planarization of intermediate layers included in a multilevel metallization process (e.g. using chemical mechanical polishing (CMP)).

A planarization process may be applied for example to reduce the surface roughness or to reduced variations in the depth profile of a surface of a carrier including structure elements having different heights, since some processes may require a flat surface (a planar surface) (e.g. high resolution lithography). A planarization process may be desired as the number of performed layering processes and patterning processes increases and as a planar surface may be required. A chemical mechanical polishing process (CMP or CMP process) may be performed, wherein this process may be selective to specific materials on the surface of a carrier (of a wafer, substrate, surface layer, and the like). A chemical mechanical polishing process (CMP) may be performed, wherein this process may be non-selective to specific materials on the surface of a carrier (of a wafer, substrate, surface layer, and the like). A planarization process may be included additionally in several processes, e.g. in layering processes, patterning processes, and the like. A chemical mechanical polishing process (CMP) may be used to remove a surface layer or a part of a surface layer.

It should be noted, that a variety of combinations of materials and processes may be used in a layering process, according to various embodiments. Depending on specific aspects or desired properties of the layer to be formed, as for example crystalline quality, surface roughness, edge covering behavior, growth speed, and yield, the most suitable process may be applied for the respective material, according to various embodiments.

According to various embodiments, some processes during manufacture of an integrated circuit may require a conformally deposited layer or conformally depositing a layer (e.g. for forming a layer stack over a sidewall of a structure element or over an inner sidewall of a cavity), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material. According to various embodiments, using for example an atomic layer deposition (ALD) process, a structure having a high aspect ratio (e.g. larger than 5, e.g. larger than 10, e.g. larger than 20) may be conformally covered with a conformal layer or conformal thin film. Further, according to various embodiments, using for example an atomic layer deposition (ALD) process, the inner sidewall of a cavity or of a hollow chamber may be covered (completely or partially) with a conformal layer or a conformal thin film. In other words, using atomic layer deposition may allow coating the inner sidewall of a cavity or the sidewalls of a trench with a material layer (e.g. with a conformal material layer), if the cavity or the trench may have at least one opening such that the material forming the material layer may reach the interior of the cavity or the trench.

According to various embodiments, at least one patterning or at least one patterning process may be used for forming an electronic structure or a battery structure, as described herein. At least one patterning or at least one patterning process may be used in a method for manufacturing an electronic structure or in a method for manufacturing a battery structure, as described herein. A patterning process may include removing selected portions of a surface layer or of a material. After a surface layer may be partially removed, a pattern (or a patterned layer or patterned surface layer or a plurality of structure elements) may remain at least one of over and in the subjacent structure (e.g. a patterned base layer may remain on a subjacent structure). Since a plurality of processes may be involved, according to various embodiments, there are various possibilities to perform a patterning process, wherein aspects may be: selecting at least one portion of a surface layer (or at least one portion of a material, or at least one portion of a wafer) which shall be removed, e.g. via at least one lithographic process; and removing the selected portions of a surface layer, e.g. via at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

An initial cleaning process or a cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) for example via wet chemical treatment. The initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). The preparation process may include applying a liquid or gaseous adhesion promoter (e.g. bis(trimethylsilyl) amine (HMDS)).

A resist, which may be included in a lithographic process, may be applied to cover a surface (e.g. a surface layer, a carrier, or a wafer, and the like) homogeneously. Applying a resist may include spin coating to generate a thin layer of the resist. Afterwards, a resist may be prebaked to drive off excess resist solvent, according to various embodiments. Several types of resists (e.g. a photoresist) may be used adapted to the process of exposing the resist to achieve desired results. Positive photoresists (e.g. DNQ-Novolac, PMMA, PMIPK, PBS, and the like) may be used, and/or negative photoresists (e.g. SU-8, poly isoprene, COP, and the like) may be used.

According to various embodiments, a lithographic process may include exposing a resist so that a desired pattern may be transferred to the resist, e.g. by using light or electrons, wherein the desired pattern may be defined by a patterned mask (e.g. a glass carrier with a patterned chromium layer). Mask-less lithography may be applied, wherein a precise beam (e.g. an electron beam or a laser beam) may be projected without using a mask directly onto the surface including the resist. The wavelength of the used light may range from the wavelength of the visible light to a smaller wavelength in the ultra violet range. The exposure may be performed using X-rays or electrons having even a shorter wavelength than ultra violet light. Projection exposure systems (steppers or scanners) may be used projecting the mask many times onto a surface including a resist to create the complete exposure pattern.

A lithographic process may include developing a resist (e.g. developing a photoresist using a photoresist developer), to partially remove the resist generating a patterned resist layer remaining on the surface (e.g. on a surface layer or on a carrier, a wafer, and the like). Developing a resist may include a post exposure bake (a heat treatment, e.g. rapid thermal processing) before the actual developing process may be performed. The developing process may include a chemical solution (a so-called developer) as for example sodium hydroxide or tetramethylammonium hydroxide (TMAH, a metal ion free developer). According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like).

Independently of the described lithographic processes, a resist may be removed completely at a desired processing stage (e.g. after at least one of an etch process, ion implantation process, and a deposition process have been performed) in a so-called resist strip process. A resist may be removed chemically and/or by using oxygen plasma.

It should be noted, that a lithographic process, including applying a resist, exposing a resist, and developing a resist may also be considered as a patterning process, wherein a patterned resist layer (a soft mask, or a resist mask) may be generated by the lithographic process. Subsequently, a pattern may be transferred from a patterned resist layer to a previously deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, an etch process, which may be included for example in a patterning process or which may be used for forming a cavity and/or a recess, may be applied to remove material from a previously deposited layer, a grown surface layer, a carrier (or substrate, or wafer), and the like. An etch process may be adapted and performed depending on the specific requirements for the desired process. An etch process may include a wet etch process and/or a dry etch process. An etch process may be selective or non-selective with respect to two different materials or may be configured to be selective or non-selective, wherein a selective etch process may provide a different etching rate for a first material than for a second material and a non-selective etch process may provide the same etching rate for a first material and a second material. An etch process may be isotropic or anisotropic or may be configured to be isotropic or anisotropic, wherein an anisotropic etch process may have different etching rates along different spatial directions and an isotropic etch process may have the same etching rates along all spatial directions. An etch process may be anisotropic due to different etching rates along different crystallographic directions of the material to be etched. An etch process using a masking material and a dry etch process (e.g. plasma etching or reactive ion etching) may allow forming anisotropic structures, e.g. recesses.

According to various embodiments, a selective etch process may include a specific etchant (e.g. a wet etchant, e.g.

a plasma etchant) which may allow etching at least one desired material while sparing another material, e.g. an exposed region of a layer or carrier may be removed (etched) while a mask material (or another material) may remain. Silicon dioxide may be removed (etched) selectively compared to silicon by using hydrofluoric acid ($HF_{aq}$) as etchant. Silicon dioxide may be removed (etched) together with silicon (non-selectively) by using a mixture of nitric acid and hydrofluoric acid ($HNO_3/HF_{aq}$) as etchant.

According to various embodiments, an anisotropic wet etch process may reveal a different etching rate along a respective crystallographic direction of a specific material. A wet etch process including potassium hydroxide (KOH) as etchant may be performed to etch silicon (e.g. a silicon wafer) anisotropically. A wet etch process including ($HNO_3/HF_{aq}$) as etchant may be performed to etch silicon (e.g. a silicon wafer) isotropically. An anisotropic dry etch process may reveal a different etching rate for surfaces with a specific geometric alignment. A physical etch process may be applied (e.g. ion beam milling, e.g. plasma etching) to perform an anisotropic removal of a material.

Further, to create at least one of a deep penetration, a steep-sided hole, and a trench in a material (e.g. in a wafer, in a substrate, in a deposited or grown layer, and the like) deep reactive-ion etching (DRIE) may be applied. A pulsed etching (time-multiplexed etching) may be applied.

According to various embodiments, a patterned layer may also serve as a mask (a so-called hard mask) for other processes like etching, ion implantation, and/or layering. Further, a patterned photoresist may also serve as a mask (a so-called soft mask). The mask material may usually be selected with regard to specific needs as for example chemical stability, e.g. to perform a selective etch process which does not affect the mask material (e.g. which may not etch away the mask material completely), or mechanical stability, e.g. to protect regions from being penetrated by ions, or to define the shape of generated structure elements during a layering process, and the like.

According to various embodiments, at least one doping process may be used for forming an integrated circuit structure, as described herein. At least one doping process may be included in a method for manufacturing an integrated circuit structure, as described herein. Various techniques may be applied or may be adapted to perform a doping process, as for example thermal diffusion and/or ion implantation. Electron doped material may be called n-type (negative-type) and hole doped material may be called p-type (positive type). In metal-oxide-semiconductor technology (MOS-technology) a channel may include electrons (n-channel, or nMOS) or holes (p-channel or pMOS) and in analogy, a metal-oxide-semiconductor field-effect transistor (MOSFET) may include an n-channel (nMOSFET) or a p-channel (pMOSFET).

According to various embodiments, a heat treatment may be applied for forming an electronic structure or a battery structure; or a heat treatment may be included in various processes (or at various process stages) during manufacture of an electronic structure or a battery structure, as described herein, e.g. in combination with a patterning process, after applying photoresist, and/or after depositing electrical contacts to alloy the electrically conductive material (e.g. a metal) with a carrier (or with the subjacent structure), or to provide optimal deposition conditions for a layering process. The heating of a carrier (a wafer, a substrate, and the like) may be performed with direct contact, e.g. a hot plate, or by radiation, e.g. using a laser or lamps. A rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

According to various embodiments, a carrier (e.g. a substrate, a wafer, and the like) may be made of semiconductor materials of various types, including silicon, germanium, Group III to V or other types, including polymers, for example, although in another embodiment, other suitable materials can also be used. The wafer substrate may be made of silicon (doped or undoped), in an alternative embodiment, the wafer substrate may be a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). A carrier may include a coated structure, e.g. a metal tape coated with silicon, and the like. A carrier may further include a polymer, a laminate, or a metal.

According to various embodiments, a battery structure (or an electronic structure) may be provided including a plurality of thin film batteries being monolithically integrated into a single carrier (e.g. into at least one of a wafer, a bare chip, a bare die, a chip, and a die). Integrating a plurality of batteries into a carrier may allow an efficient manufacturing of a thin film based battery structure, wherein the thin film based battery structure may have enhanced properties compared to a single thin film battery. Depending on the arrangement of the plurality of thin film batteries, for example, the energy storage capacity of the thin film based battery structure may be enhanced compared to a commonly used thin film battery; e.g. the thin film batteries of the plurality of thin film batteries may be at least partially stacked over each other. Further, in contrast to a thin film battery, a battery structure including a plurality of thin film batteries may be flexible concerning the operated (provided or applied) voltages and currents, firstly during operation of the battery structure and secondly during charging of the battery structure. Further, the wiring or the metallization electrically connecting the thin film batteries of the plurality of thin film batteries with each other may be adapted. Referring to this, two or more thin film batteries of the battery structure may be connected in serial (e.g. to an externally accessible contact structure) to change the voltage characteristics of the battery structure. Further, two or more thin film batteries of the battery structure may be connected in parallel (e.g. to an externally accessible contact structure) to change the electrical current characteristics of the battery structure Illustratively, a battery structure including a plurality of thin film batteries may be more flexible in use, e.g. the battery structure may be charged faster since the capacity of each thin film battery of the plurality of batteries may be small and the thin film batteries included in the battery structure may be charged in parallel. Further, the battery structure including a plurality of batteries may be formed on wafer level and may be packaged easily, since the battery structure may be segmented from the beginning. Further, integrating a plurality of batteries into a battery structure may allow providing electrical contacts being connected to the plurality of thin film batteries, wherein the electrical contacts may be configured to provide different voltages at the same time, e.g. cell-voltages including a multiplicity of the material depended cell-voltage of a single thin film battery cell. Finally, the battery structure including a plurality of batteries may be controlled by an integrated circuit structure, e.g. being integrated into the same carrier as the battery structure, such that the voltage characteristics and/or the electrical current characteristics of the battery structure may be adapted via the integrated circuit structure as desired, e.g. during use of the battery structure or e.g. during charging of battery structure. Therefore, the battery structure may be charged under optimal conditions for charging (e.g. at high currents at a specific charging voltage) and may be operated under different conditions being optimal for operating the battery (e.g. at different voltages or different maximal currents).

In general, a battery or a rechargeable battery (e.g. a metal hydride based thin film battery or a lithium-ion based thin film battery) may include at least two electrodes, a separator and an electrolyte. To store energy for example in a rechargeable lithium-ion based thin film battery, lithium-ions may be chemically bound to the negative electrode.

In case, that the rechargeable battery may include a solid state electrolyte, the electrolyte itself may have the function of the separator, such that an additional separator or an additional separator layer may not be necessary. According to various embodiments, to achieve electronic conductivity of the thin film battery, at least two current collectors may be required, e.g. respectively adjoining at the two electrodes. A current collector for a battery may include an electronic conductor having a high electrical conductivity, like for example Cu, TiN, Pt, Al, AlCu, W, Au.

Further, in case of integrating one or more lithium-ion based thin film batteries into a carrier (chip or wafer), the lithium included for example in the layers forming the thin film batteries, may be separated from other electronic components or from the carrier, e.g. via a barrier layer or a barrier structure to prevent lithium diffusion out of the batteries into the electronic components or into the carrier. According to various embodiments, a lithium barrier may be for example a conformally deposited (e.g. close and dense) layer or thin film including at least one material of the following group of materials: titanium nitride, tungsten nitride, tantalum nitride and silicon nitride. According to various embodiments, the barrier function and the current collection function may be combined within a single layer, e.g. by providing an electrically conductive barrier layer including for example titanium nitride.

According to various embodiments, an electronic structure, as described herein, may be regarded as a battery structure, illustratively in the case, if the battery structure may be a standalone device. Further, according to various embodiments, the battery structure may be a part of an electronic structure or a part of an electronic device. Further, an electronic structure or an electronic device, as described herein, may be regarded as an electronic-ionic device, or the battery structure may be regarded as an electronic-ionic structure or as a part of an electronic-ionic device. Referring to this, a battery or a battery structure may include a combination of electronic structures and ionic structures; e.g. including the movement of electrons driven by electric fields (electronic conductivity) and the movement of ions driven by electric fields and/or driven by chemical potentials (ionic conductivity). The electronic movement may happen at the outer parts of the battery (e.g. the current collectors or the so-called plus pole and minus pole). The ionic movement may happen at the inner parts of the battery (e.g. the anode, electrolyte, and/or cathode). In accordance to the term "electronics", the term "ionics" may be used, wherein the battery or the battery structure may be referred to as an electronic-ionic device. In other words, an electronic device, as described herein, may be also regarded as electronic-ionic device.

FIG. 1A illustrates a schematic view of an electronic structure 100 or of a battery structure 100, according to various embodiments. The electronic structure 100 may include a semiconductor carrier 102 (e.g. a silicon carrier, a silicon wafer or a silicon chip), and a plurality of thin film batteries 104 being monolithically integrated with (or into) the semiconductor carrier 102.

According to various embodiments, the thin film batteries 104a, 104b, 104c of the plurality of thin film batteries 104 may be separated from each other, in the way that the respective electrolyte regions or charge storage regions of the respective thin film batteries 104a, 104b, 104c may be separated from each other. In other words, the charge storing ions of the respective thin film batteries may be separated from each other, such that each battery of the thin film batteries 104a, 104b, 104c may have a specific charge storing capacity. Illustratively, a thin film battery structure may be separated into or include a plurality of thin film batteries 104a, 104b, 104c, wherein the plurality of thin film batteries 104a, 104b, 104c may be electrically conductively connected to each other, wherein the charge storing regions of the batteries are spatially separated from each other.

According to various embodiments, the electronic structure 100 may include a number (n) of thin film batteries 104a, 104b, 104c having a collective charge storage capacity, C, wherein each thin film battery of the plurality of thin film batteries 104 may have a single charge storage capacity, C/n. Therefore, the electronic structure 100 may include a plurality of thin film batteries 104, e.g. two or more than two, e.g. ten or more than ten, e.g. one hundred or more than one hundred batteries thin film batteries, or even up to one thousand thin film batteries, wherein each thin film battery of the plurality of thin film batteries 104 may have a relatively small single charge storage capacity, C/n, combined to a multiple larger collective charge storage capacity, C. This may allow a faster charging of the battery structure 100 (or the electronic structure 100) including the plurality of thin film batteries 104, since the minimal charging time for charging a single battery cell may be limited by the respective capacity of the single battery cell. Illustratively, the plurality of thin film batteries 104 may be charged in parallel such that the battery structure 100 including a number of n thin film batteries having the collective charge storage capacity, C, may be charged much faster than a single battery cell having the same charge storage capacity, C.

The thin film batteries 104a, 104b, 104c of the plurality of thin film batteries 104 may include at least one type of the following type of batteries: a rechargeable thin film battery (a secondary cell), a solid state electrolyte thin film battery, a rechargeable lithium-ion based battery, a rechargeable lithium-ion based thin film battery, a rechargeable lithium-ion based solid state electrolyte battery, a rechargeable lithium-ion based solid state electrolyte thin film battery, and the like, e.g. a lithium-sulfur battery or a lithium-air battery. Further, the thin film batteries 104a, 104b, 104c of the plurality of thin film batteries 104 may include at least one type of the following type of batteries: a rechargeable nickel-metal hydride battery, a rechargeable nickel-metal hydride thin film battery, a rechargeable nickel-metal hydride based solid state electrolyte thin film battery, and the like.

A thin film battery (e.g. a thin film battery 104a, 104b, 104 of the plurality of thin film batteries 104), as described herein, may include a layer stack (a battery layer stack) including the active battery layers, e.g. a cathode layer, an electrolyte layer, an anode layer, an anode current collector layer and a cathode current collector layer.

According to various embodiments, the carrier 102 may have a first surface 102a, wherein the thin film batteries 104 may be arranged at least one of on and over said first surface 102a. Further, the thin film batteries of the plurality of thin film batteries 104 may be arranged at least one of over and in the carrier 102.

According to various embodiments, a battery (the thin film batteries 104 or a part of the thin film batteries 104) may be arranged at the backside of the carrier 102. Thereby, an electrical connection may be formed to connect a frontside wiring and a backside wiring of the thin film batteries 104, e.g. by via through silicon techniques.

As illustrated in FIG. 1A, at least two thin film batteries 104b, 104c of the plurality of thin film batteries 104 may be formed over the carrier having a (e.g. lateral or vertical) distance 107 between each other. In other words, the thin film batteries of the plurality of thin film batteries 104 may be spatially separated from each other.

According to various embodiments, each thin film battery of the plurality of thin film batteries 104 may have a charge storage capacity in the range from about 0.1 µAh (micro-ampere hours) to about 100 µAh. Further, the battery structure 100 or the electronic structure 100 may include up to 1000 thin film batteries 104, which may result in a collective charge storage capacity for the battery structure 100 of up to about 100 mAh. Depending on size of a wafer (the wafer may be for example a 300 mm wafer or may have a diameter of equal to or larger than about 300 mm) and the arrangement of the thin film batteries of the plurality of thin film batteries 104, the charge storage capacity of the battery structure or the electronic structure may larger than 100 mAh, e.g. up to about 1 Ah, e.g. up to about 10 Ah, or even up to about 100 Ah.

According to various embodiments, the thin film batteries of the plurality of thin film batteries 104 may be formed over the whole carrier 102 having a distance 107 between each other, e.g. in the range from about several tens of nanometers to about several micrometers, several tens of micrometers, or to about several hundreds of micrometers. In other words, a wafer may be processed as a battery structure 100, wherein the plurality of thin film batteries 104 may be disposed over the whole main processing surface of the wafer (silicon wafer). According to various embodiments, the processed wafer may be diced after the thin film batteries 104 have been formed, such that the battery structure 100 being processed on wafer-level may be separated into several battery structures 100 on chip-level.

Further, the thin film batteries 104 may be processed on chip-level, wherein the wafer is already diced before the plurality of thin film batteries is formed. Further, the thin film batteries 104 of the plurality of thin film batteries 104 may be formed over a readily processed integrated circuit 102. In other words, the carrier 102 may include a readily processed integrated circuit 102, e.g. a CMOS integrated circuit, a bipolar transistor, an IGBT, and/or a micro-electro-mechanical system (MEMS), or other component or structure, as for example: a chip, a memory chip, a die, a microprocessor, a microcontroller, a memory structure, a charge storage memory, a random access memory, a dynamic random access memory, a logic circuit, a sensor, a nano-sensor, an integrated transceiver, a micro-mechanical device, a micro-electronic device, a nano-electronic device, an electrical circuit, a digital circuit, an analog circuit, and any other electronic device based on semiconductor technology, as for example a radio-frequency identification (RFID) chip and a chip card module.

According to various embodiments, each thin film battery of the plurality of thin film batteries 104 may include one or more contacts or regions for electrically contacting the thin film battery. According to various embodiments, the current collector layers of the respective thin film battery may be used to individually electrically contact the thin film batteries of the plurality of thin film batteries 104. Illustratively, each thin film battery 104a, 104b, 104c may include at least two battery contact regions (a positive terminal and a negative terminal).

Further, according to various embodiments, two or more than two thin film batteries of the plurality of thin film batteries 104 may be electrically conductively coupled to each other; and thereby, the electrical properties of the battery structure 100 may be adapted.

Figure 1B:
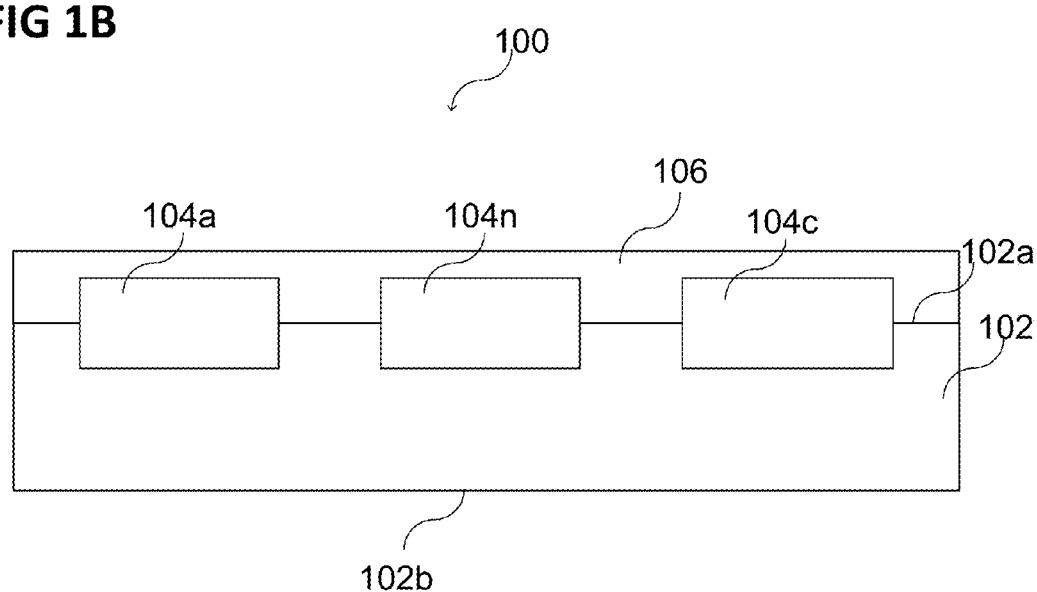

As illustrated in FIG. 1B in a schematic view, a contact structure 106 may be disposed over the plurality of thin film batteries 104, wherein the contact structure 106 may be configured to electrically connect the plurality of thin film batteries 104 (e.g. at least two thin film batteries of the plurality of thin film batteries, or all thin film batteries of the plurality of thin film batteries) with each other. Thereby, at least two thin film batteries of the plurality of thin film batteries 104 may be electrically conductively coupled in series or in parallel.

Further, the contact structure 106 may include a plurality of electrical contacts or contact pads for electrically connecting the electronic structure 100 or the battery structure 100 to a peripheral device, e.g. to an electronic device to be supplied with energy or to a charging device for charging the electronic structure 100 or the battery structure 100.

According to various embodiments, the contact structure 106 may include a wiring structure, e.g. one or more metal lines, e.g. one or more vias, e.g. one or more landing pads, electrically connecting the thin film batteries of the plurality of thin film batteries 104 with each other and/or with the plurality of electrical contacts or contact pads. The wiring structure may be embedded into a dielectric material or into a dielectric layer. Further, the electronic structure 100 or the battery structure 100 may include a plurality of contact structure layers forming the contact structure 106.

According to various embodiments, the electronic structure 100 or the battery structure 100 may include a metallization layer 106 or a metallization structure 106 electrically connecting the thin film batteries of the plurality of thin film batteries 104 with each other and/or with the plurality of electrical contacts or contact pads. In other words, the contact structure 106 may include or may be a metallization structure, e.g. a single-level metallization or a multi-level metallization.

Figure 1C:
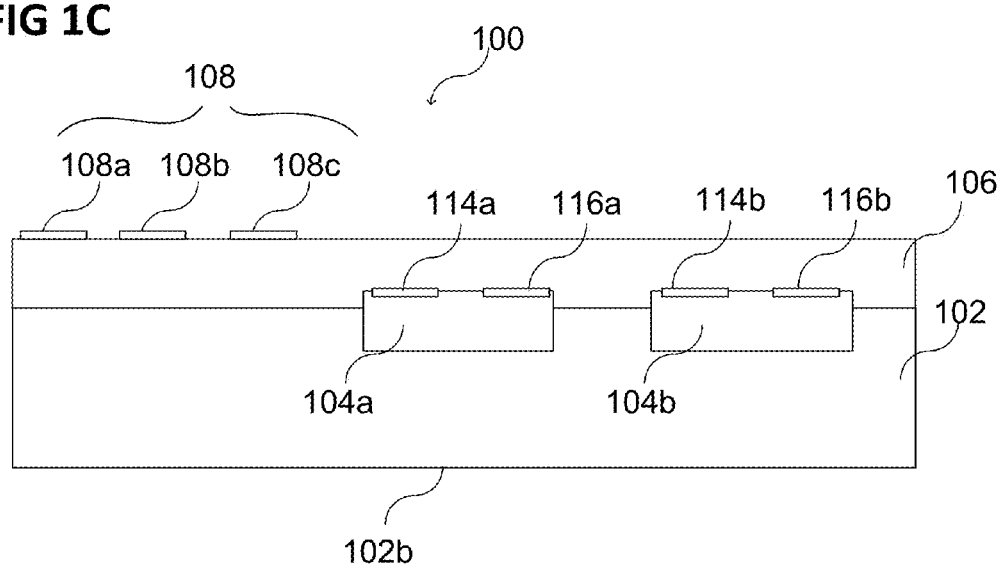

As for example illustrated in FIG. 1C, the contact structure 106 may be configured to electrically connect the respective terminals 114a, 114b, 116a, 116b of the thin film batteries 104a, 104b to a respective contact pad 108a, 108b, 108c of the contact structure 106. Illustratively, the contacts pad 108a, 108b, 108c of the contact structure 106 may be configured and may serve to access the thin film batteries 104a, 104b of the plurality of thin film batteries 104. According to various embodiments, the contact structure 106 may include two or more than two contact pads, e.g. three contact pads or more than three contact pads. According to various embodiments, the number of contact pads being included in the contact structure 106 may be in the range from about 2 (e.g. in the case all thin film batteries of the plurality of thin film batteries are connected to each other) to about 2000 (e.g. in the case each thin film battery of the plurality of thin film batteries has to be addressed individually), depending on the desired wiring design for electrically connecting the thin film batteries of the plurality of thin film batteries 104.

Figure 1D:
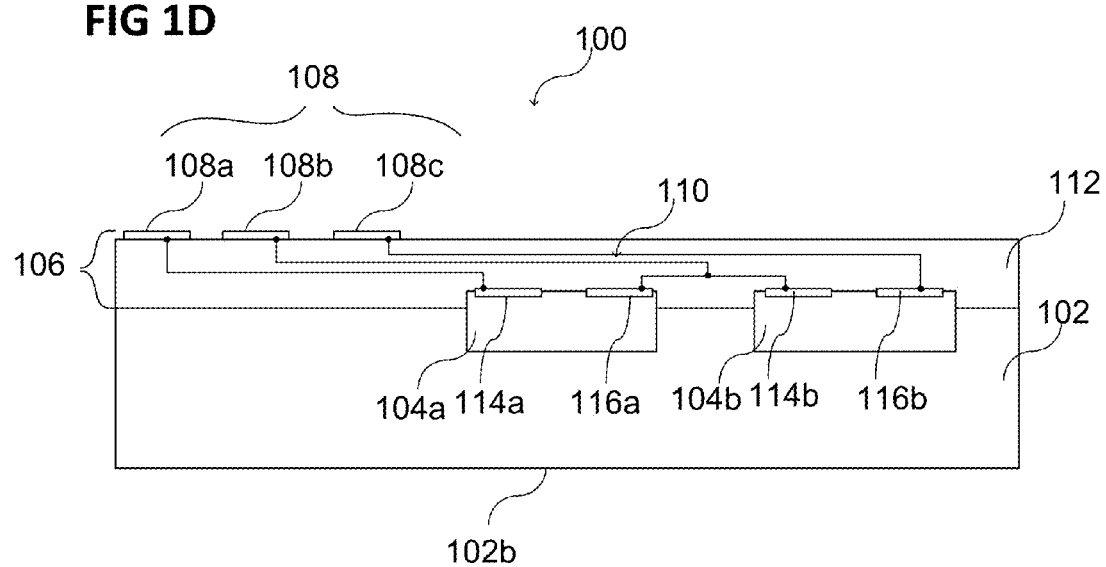
Figure 1E:
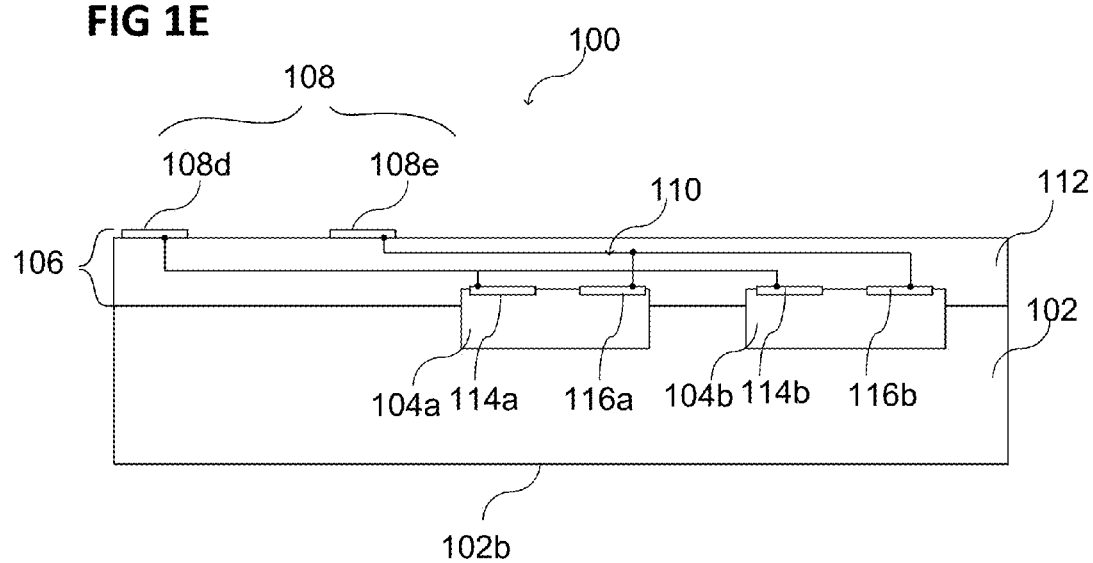

As shown in the FIGS. 1D and 1E, the contact structure 106 may be configured to electrically connect at least two thin film batteries 104a, 104b of the plurality of thin film batteries 104 to at least two (e.g. two or three) contacts pads 108a, 108b, 108c of the contact structure 106 in series or in parallel. Without loss of generality, the first terminals 114a, 114b of the thin film batteries 104a, 104b may be the positive terminals and the second terminals 116a, 116b may be the negative terminals. According to various embodiments, the wiring 110 of the contact structure 106 may be embedded into a dielectric material 112, as already described.

As schematically illustrated in FIG. 1D, the first terminal 114a of the first thin film battery 104a may be electrically conductively connected to the first contact pad 108a of the contact structure 106. Further, the second terminal 116b of the second thin film battery 104b may be electrically conductively connected to the third contact pad 108c of the contact structure 106. Further, the second terminal 116a of the first thin film battery 104a and the first terminal 114b of the second thin film battery 104b may be electrically conductively connected to each other; and optionally to the second contact pad 108b of the contact structure 106.

Referring to this, the first thin film battery 104a and the second thin film battery 104b may be electrically connected to the contact pads 108 of the contact structure 106 in series. Further, the contact structure 106 may be configured such that between the first contact pad 108a and the second contact pad 108b a first voltage may be provided (e.g. the cell voltage provided by the first thin film battery 104a), and between the first contact pad 108a and the third contact pad 108c a second voltage may be provided (e.g. the cell voltage provided by the first thin film battery 104a and the second thin film battery 104b (the summed up voltages of the thin film batteries 104a, 104b)).

Illustratively, since the battery structure 100 may include a plurality of thin film batteries 104, the provided voltages at the contacts pads of the contact structure 106 may be adapted in the way as illustrated herein or in a similar way which may allow configuring the battery structure 100 as desired. Further, different sets of contacts of the plurality of contacts pads 108 may be used for different applications of the battery structure 100, e.g. a first set of contacts of the plurality of contacts pads 108 may be used for operating the battery structure 100 and a second set of contacts of the plurality of contacts pads 108 may be used for charging the battery structure 100 (e.g. the thin film batteries of the battery structure 100 may be charged in parallel and may be operated in series).

Further, as schematically illustrated in FIG. 1E, the first thin film battery 104a and the second thin film battery 104b may be electrically connected in parallel to a fourth contact pad 108d and a fifth contact pad 108e. Therefore, according to various embodiments, the first terminal 114a of the first thin film battery 104a and the first terminal 114b of the second thin film battery 104b may be electrically conductively connected to each other and to the fourth contact pad 108d of the contact structure 106. Further, the second terminal 116a of the first thin film battery 104a and the second terminal 116b of the second thin film battery 104b may be electrically conductively connected to each other and to the fifth contact pad 108e of the contact structure 106.

According to various embodiments, due to the parallel connection of the thin film batteries 104a, 104b, the thin film batteries 104a, 104b may charge or discharge at the same rate, so that the charging level of the thin film batteries 104a, 104b may be equal. Further, additional electrical connections between the thin film batteries 104a, 104b and additional contact pads of the contact structure 106 may be provided, e.g. to allow a battery balancing and/or a battery redistribution. This may increase the efficiency and/or the lifetime of the battery structure 100, e.g. in the case the thin film batteries 104 may be lithium-ion based batteries. The balancing of the thin film batteries of the plurality of thin film batteries 104 may be configured active or passive.

According to various embodiments, as also described in the following, the battery structure 100 may include a battery management system (BMS), which may allow active balancing of the thin film batteries 104, temperature monitoring, and the like. The battery management system may be included in an integrated circuit structure 118, as described in the following, referring for example to FIG. 1F. Integrating a battery management system or any other control system into the battery structure 100 or into the electronic structure 100 including a plurality of thin film batteries 104 may enable a variety of functionalities, as for example: an optimal charging of the battery structure 100, an enhanced lifetime of the battery structure 100, a larger effective capacity of the battery structure 100, error management (e.g. in the case a thin film battery of the plurality of thin film batteries may be broken, the broken battery may be excluded from the battery structure 100 without a significant loss of capacity), a temperature control to monitor the functioning of the battery structure 100, a voltage adaptation to specific requirements (e.g. an in-time change of the voltage provided by the battery structure 100), an electrical current (maximal current) adaptation to specific requirements (e.g. an in-time change of the electrical current supported by the battery structure 100), and the like. Such a control system may be included in an integrated circuit structure 118 arranged over the carrier 102, e.g. on the same side 102a of the carrier 102 as the plurality of thin film batteries 104.

Figure 1F:
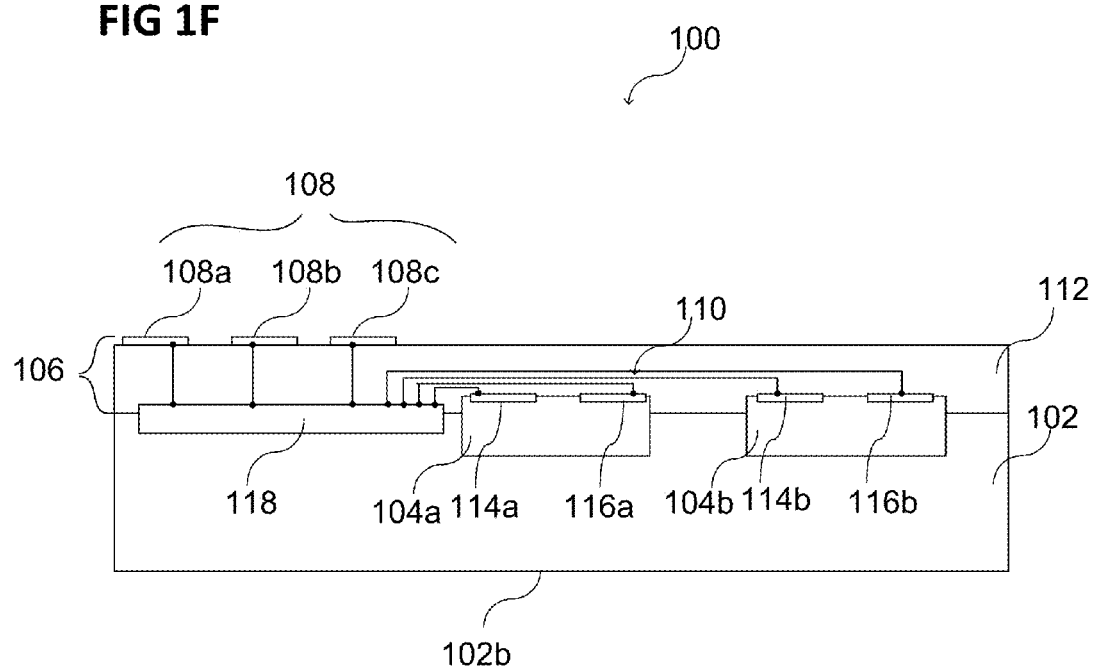

FIG. 1F illustrates a schematic view of an electronic structure 100 or of a battery structure 100 including an integrated circuit structure 118 and a contact structure 106, according to various embodiments. The integrated circuit structure 118 may be electrically conductively connected to the plurality of thin film batteries and to the plurality of contact pads 108 via the contact structure 106 (via the wiring 110). According to various embodiments, the integrated circuit structure 118 may be configured to realize and/or to manage the electrical interconnection of the thin film batteries of the plurality of thin film batteries 104 among themselves and/or the electrical interconnection between the thin film batteries of the plurality of thin film batteries 104 and the contact pads of the plurality of contact pads 108 of the contact structure 106.

According to various embodiments, controlling the electrical circuitry of the battery structure 100 or the electronic structure 100, the integrated circuit structure 118 may include at least one of the following components: one or more switches, one or more transistors, one or more bridging structures, a control unit, a logic chip, and the like.

Further, the integrated circuit structure 118 may be configured to selectively couple the thin film batteries of the plurality of thin film batteries 104 to each other and/or to selectively decouple the thin film batteries of the plurality of thin film batteries from 104 each other. The integrated circuit structure 118 may decouple and couple the thin film batteries of the plurality of thin film batteries from 104 by controlling a switching structure and/or a bridging structure. In other words, this coupling and decoupling may be referred to the electrically conductive connection. According to various embodiments, the integrated circuit structure 118 may be configured to control one or more switches or transistors to selectively couple the thin film batteries of the plurality of thin film batteries 104 to each other and/or to selectively decouple the thin film batteries of the plurality of thin film batteries from 104 each other; and/or to selectively couple the thin film batteries of the plurality of thin film batteries 104 to the respective contacts of the plurality of contacts 108 and/or to selectively decouple the thin film batteries of the plurality of thin film batteries from 104 from the respective contacts of the plurality of contacts 108. Referring to this, a coupling of the thin film batteries may include an electrically conductive connection between the thin film batteries, e.g. between one or more current collector layers of the thin film batteries.

According to various embodiments, the integrated circuit structure 118 may be configured to control the number of thin film batteries of the plurality of thin film batteries 104 being electrically coupled to each other in parallel, thereby controlling the current characteristics of the battery structure 100. Further, according to various embodiments, the integrated circuit structure 118 may be configured to control the number of thin film batteries of the plurality of thin film batteries 104 being electrically coupled to each other in series, thereby controlling the voltage characteristics of the battery structure 100.

Further, according to various embodiments, the thin film batteries 104a, 104b may itself include more than one battery layer stack, e.g. a plurality of battery layer stacks. Therefore, if each thin film battery of the plurality of thin film batteries 104 may include a number of m battery layer stacks (each battery layer stack providing a battery cell), the battery structure 100 or the electronic structure 100 may include m times n thin film battery cells or thin film batteries. Further, according to various embodiments, the abovementioned m times n battery cells may be processed k times over the carrier 102, e.g. as a battery cell arrangement stack, such that the battery structure 100 or the electronic structure 100 may include m times n times k single battery cells (c.f. FIGS. 7A to 7D and FIGS. 8A and 8B). This may allow the manufacture of a dense arrangement of a large number of thin film batteries on a single wafer.

As described herein, an electronic structure 100 and a battery structure 100 may be provided which may be for example flexible in use and/or may have for example an enhanced lifetime (compared to commonly used thin film batteries) and/or an decreased charging time to get completely charged compared to commonly used thin film batteries having the same or a similar charge storing capacity.

Figure 2A:
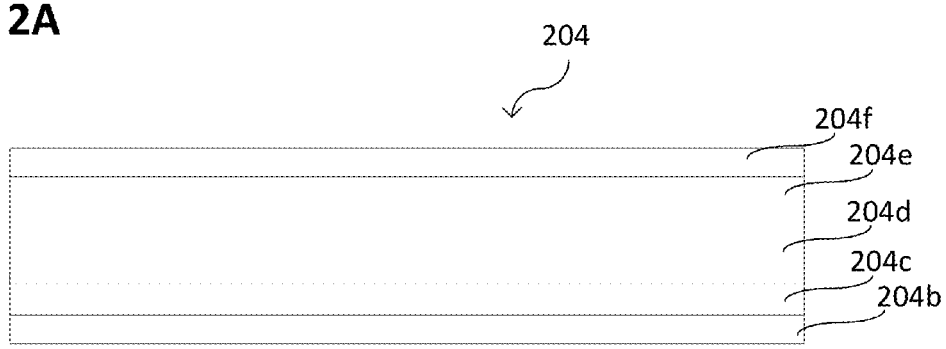
FIGS. 2A and 2B show respectively a battery layer stack in a schematic cross sectional view or side view, according to various embodiments.
Figure 2B:
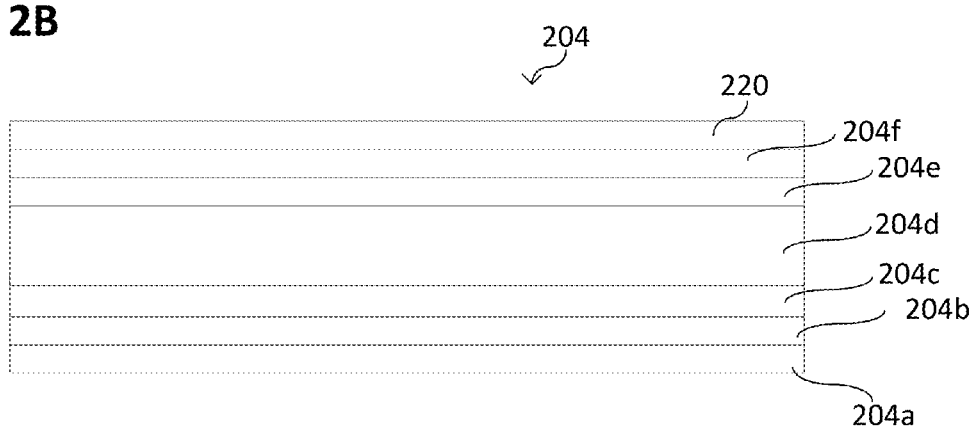

FIG. 2A and FIG. 2B show respectively a detailed view of a battery layer stack 204 (e.g. of a thin film battery 104a, 104b, 104c), already described herein. The layer stack 204 may include at least a first current collector layer 204b, a first electrode layer 204c, an electrolyte layer 204d, a second electrode layer 204e, and a second current collector layer 204f, to provide a thin film battery 104a, 104b, 104c.

A thin film battery 104a, 104b, 104c (also referred to as battery 104 in the following) of the plurality of thin film batteries 104 may also include at least a first current collector region 204b, a first electrode region 204c, an electrolyte region 204d, a second electrode region 204e, and a second current collector region 204f, wherein the specific design of the regions may be adapted to the desired properties of the battery 204, e.g. to provide a high capacity per volume.

The first electrode layer 204c may be an anode layer or may function as an anode of the thin film battery 104, and therefore, the first current collector layer 204b may be the anode current collector layer 204b. Referring to this, the second electrode layer 104e may be a cathode layer or may function as a cathode of the battery 104, and therefore, the second current collector layer 204f may be the cathode current collector layer 204b.

Alternatively, the first electrode layer 204c may a cathode layer or may function as a cathode of the battery 104, and therefore, the first current collector layer 204b may be the cathode current collector layer 204b. Referring to this, the second electrode layer 204e may be an anode layer or may function as an anode of the battery 104, and therefore, the second current collector layer 204f may be the anode current collector layer 204b.

A current collector layer or current collector region (e.g. the anode current collector layer and the cathode current collector layer) may include or may consist of at least one material of the following group of materials, the group including: an electrically conductive material, a metal, a metal nitride, a transition metal, a transition metal nitride, platinum, copper, aluminium, aluminum nano-rods, gold, titanium nitride, vanadium nitride, molybdenum nitride, tantalum nitride. At least one current collector layer may serve as diffusion barrier (e.g. at least one current collector layer may be titanium nitride diffusion barrier), wherein the current collector layer may prevent or at least reduce a diffusion of atoms, ions, or material (e.g. lithium and/or lithium-ions) from the solid state electrolyte battery 104 into the integrated circuit structure 118 or into the carrier 102. At least one current collector layer may serve as diffusion barrier (e.g. at least one current collector layer may be titanium nitride diffusion barrier), wherein the current collector layer may prevent or at least reduce a diffusion of atoms, ions, or material (e.g. lithium and/or lithium-ions) from the integrated circuit structure 118 or the carrier 102 into the solid state electrolyte battery 104.

The anode layer or the anode region may include or may consist of at least one material of the following group of materials, the group including: silicon, polysilicon, amorphous silicon, carbon, amorphous carbon, graphite, $Li_4Ti_5O_{12}$ (LTO), $CuN_3$, titanium oxide ($TiO_2$), or any other suitable anode material, as for example titanium, a metal silicide (e.g. calcium silicide, magnesium silicide, molybdenum silicide), $Li_{15}Si_4$, a lithium containing alloy (e.g. $Li_{22}M_5/M$ (M=Ge, Sn, Pb, Si)), $Li_{4.4}Si$, $Li_{4.4}Ge$, tin-oxide based glasses (e.g. $SnO-B_2O_3-P_2O_5-Al_2O_3$), $SnS-P_2S_5$, $Li_2S-P_2S_5$, silicon containing transition metal nitrides (e.g. $SiM_xN_y$ (M=Co, Ni, Cu)), Ni coated by $TiO_2$, Sn, Ge, Al, Pb, In, ZnO. The anode may be defined herein for example as the negative electrode during charge of the battery 104. According to various embodiments, the anode may include a mixture of anode materials (as described before) or a mixture of an anode material with another additional material to provide a micro-composite material as anode material.

The cathode may include or may consist of at least one material of the following group of materials, the group including: lithium, cobalt, nickel, aluminium, oxygen, iron, phosphorous, sulfur, manganese, vanadium, manganese spinel, lithium nickel manganese cobalt, lithium iron phosphate (doped or undoped), transition metal oxides (e.g. $MnO_2$, $Fe_3O_4$, $Co_3O_4$, $TiO_2$, NiO), olivine (e.g. $LiCoPO_4$), $LiCoO_2$, $LiNiO_2$, $LiNi_xMn_yO_2$, $LiNi_{1-x}Co_xO_2$, $LiNi_{0.85}Co_{0.1}Al_{0.05}O_2$, $LiNi_{0.33}Co_{0.33}Mn_{0.33}O_2$, $LiMn_2O_4$ (spinel structure), $Li_{43}Ti_{5/3}O_4$, $V_2O_5$, amorphous $V_2O_5$, $LiMn_2O_4$, $Li_2S$, S, and $LiFePO_4$, or any other suitable cathode material, e.g. including nickel or stainless steel. The anode may be defined herein for example as the positive electrode during charge of the battery 104.

The electrolyte layer or electrolyte region (e.g. a solid state electrolyte layer or region) may include or may consist of at least one material of the following group of materials, the group including: lithium, phosphorus, lanthanum, titanium, lithium phosphorus oxynitride, lithium lanthanum titanium oxide (LLTO), a polymer, poly-oxyethylene, $LiPO_{1-x}N_{1-y}$, thio-LISICON materials (lithium superionic conductor, e.g. $Li_xGe_yP_zS_4$), $Li_xM_{1-y}M'_yS_4$ (M=Si or Ge, and M'=P, Al, Zn, Ga, or Sb), $Li_xAl_yTi_z(PO_4)$ or any other suitable electrolyte, e.g. sodium super ion conductors (NASICON), NASICON-type materials (e.g. $Na_{1+x+4y}M_{2-1}Si_xP_{3-x}O_{12}$, $0 \leq x \leq 3$, $0 \leq y \leq 1$, (M=Ti, Hf, or Zr)), $Li_2S$—$P_2S_5$, $Li_2S$—$P_2S_5$—$SiS_2$, $Li_2S$—$SiS_2$, or oxysulfide glass (e.g. $[[Li_2S]_{0.6}[SiS_2]_{0.4}]_{1-x}[Li_xMO_y]_x$ (M=Si, P, Ge, B, Al, Ga, In)). A solid state electrolyte may be regarded as a material which may transport electrical charge due to the movement of ions in the material, e.g. through channels, voids, or empty crystallographic positions in their crystal structure.

A current collector layer (e.g. the first current collector layer 204b and/or the second current collector layer 204f) may have a thickness in the range from about 5 nm to about 100 nm, e.g. in the range from about 10 nm to about 50 nm. According to various embodiments, the layer thickness of a current collector layer may depend on the specific electrical conductivity of the respective layer serving as current collector layer. According to various embodiments, e.g. to support large current flows, a current collector layer may have a thickness of up to several micrometers, e.g. a thickness in the range from about 1 μm to about 10 μm.

The anode layer may have a thickness for example in the range from about 5 nm to about 100 nm, e.g. larger than 100 nm, e.g. from about 10 nm to about 50 nm, e.g. smaller than 10 nm, e.g. larger than 50 nm. According to various embodiments, e.g. to achieve large energy densities, an anode layer may have a thickness of up to several tens of micrometers, e.g. a thickness in the range from about 1 μm to about 50 μm.

According to various embodiments, the cathode layer may have a thickness for example in the range from about 5 nm to about 100 nm, e.g. larger than 100 nm, e.g. from about 10 nm to about 50 nm, e.g. smaller than 10 nm, e.g. larger than 50 nm. According to various embodiments, e.g. to achieve large energy densities, a cathode layer may have a thickness of up to several tens of micrometers, e.g. a thickness in the range from about 1 μm to about 50 μm.

The electrolyte layer 204d may have a thickness for example in the range from about 5 nm to about 100 nm, e.g. larger than 100 nm, e.g. from about 10 nm to about 50 nm, e.g. smaller than 10 nm, e.g. larger than 50 nm.

The anode layer may have a thickness of about 30 nm, the cathode layer may have a thickness of about 30 nm, and the electrolyte layer may have a thickness of about 30 nm.

The thickness of the anode layer and the corresponding thickness of the cathode layer may be selected according to the charge storage properties of the respective material forming the anode layer and the corresponding cathode layer.

The thickness of the electrolyte layer 204d may be large enough, e.g. larger than 5 nm, to function as an electrolyte layer, e.g. to conduct lithium-ions, or e.g. being transparent for lithium-ions (wherein the electrolyte layer may not allow a distinct transport of electrons). The electrolyte layer 204d may be deposited using atomic layer deposition, e.g. atomic layer chemical vapor deposition, resulting in a smooth, closed, and dense layer.

After the layer stack 204 (or the battery 104) has been formed, an annealing process, e.g. a thermal treatment, may be carried out, e.g. to introduce recrystallization processes or other improvements, as for example mechanical stability.

The layer thickness of the anode layer in the battery 104 may be limited due to physical or chemical reasons, e.g. a silicon layer as an anode may degrade while storing lithium-ions, if the silicon layer may be too thick, e.g. thicker than 50 nm or thicker than 100 nm for example. The charge storage capacity of the battery 104 may increase with an increased volume of the charge storing anode layer, e.g. the volume of the material providing the anode. According to various embodiments, the thin film battery 104 may be formed over and in a recess structure or a cavity structure, e.g. conformally covering the inner surface of the recess structure or the cavity structure, so that the surface area of the anode layer may change according to the shape and size of the recess structure or the cavity structure. Therefore, the charge storing capacity of a single battery cell 104 may be adapted (e.g. increased) while the layer thickness of the charge storing anode layer may have a desired thickness.

As shown in FIG. 2B, the battery layer stack 204 may further include a first dielectric layer 204a, including an electrically insulating material, e.g. an electrically insulating oxide, e.g. silicon oxide. The first dielectric layer 204a may electrically separate the battery 104 (the battery layer stack 204) from the carrier 102, from the integrated circuit structure 118, and/or partially from the contact structure 106. The layer stack 204 may further include a protection layer 220 on top of the second current collector layer 204f, e.g. to protect the thin film battery 104 and accordingly the battery layer stack 204.

According to various embodiments, the battery layer stack may be adapted to the specific needs, e.g. the battery layer stack may be formed as a multi-level stack including a plurality of battery layer stacks 204.

FIG. 3A illustrates a flow diagram of a method 300 for manufacturing an electronic structure 100 or a battery structure 100, according to various embodiments; the method including: in 310, providing a semiconductor carrier 102; and, in 320, forming a plurality of thin film batteries 104 monolithically integrated with the semiconductor carrier 102.

Forming the plurality of thin film batteries 104 may include forming a plurality of battery layer stacks 204, wherein each of the battery layer stacks may include at least one cathode layer, at least one anode layer, and at least one electrolyte layer being arranged between the at least one cathode layer and the at least one anode layer. Forming the plurality of thin film batteries 104 may include forming more than one layer stack 204 respectively including the functional layers 204b, 204c, 204d, 204e, 204f, as already described, and optionally the additional layers 220, 204a, as already described.

Forming the plurality of thin film batteries 104 may further include forming at least one cathode current collector layer adjoining the at least one cathode layer and forming at least one anode current collector layer adjoining the at least one anode layer.

According to various embodiments, forming a plurality of batteries 104 may include forming a plurality of lithium-ion based thin film batteries.

According to various embodiments, method 300 of manufacturing an electronic structure 100 or a battery structure 100 may further include: providing an integrated circuit structure 118, wherein providing an integrated circuit structure 118 may include providing at least one electronic component of the following group of electronic components, the group including: an integrated circuit, a control circuit, a battery management circuit, a microprocessor, a logic chip, and the like.

Further, process 310 of providing a semiconductor carrier 102 may include for example providing an electronic circuit at least one of over and in the carrier 102. In other words, providing a semiconductor carrier 102 may include creating (or forming) an electronic circuit, wherein the electronic circuit may include at least one of the following basic semiconductor technologies: MOS-technology (metal oxide semiconductor technology), nMOS-technology (n-channel MOS-technology), pMOS-technology (p-channel MOS-technology), CMOS-technology (complementary metal oxide semiconductor technology).

Further, process 310 of providing a semiconductor carrier 102 may include at least one of the following: one or more layering processes, one or more patterning processes, one or more doping processes, one or more thermal treatments, one or more cleaning processes, one or more polishing processes, and any other desired (or necessary) semiconductor process, e.g. forming a metallization structure (e.g. one or more metallization processes).

Process 310 of providing a semiconductor carrier 102 may include forming or at least partially forming at least one of the following: a chip, a memory chip, a die, a microprocessor, a microcontroller, a memory structure, a charge storage memory, a random access memory, a dynamic random access memory, a logic circuit, a sensor, a nano-sensor, an integrated transceiver, a micro-mechanical device, a micro-electronic device, a nano-electronic device, an electrical circuit, a digital circuit, an analog circuit, and any other electronic device based on semiconductor technology, e.g. a light emitting diode (LED), an organic light emitting diode (OLED), or other optical devices.

Illustratively, the carrier 102 may include a readily processed electronic circuit in any semiconductor technology. Referring to this, forming an electronic circuit, e.g. which may be for example included in process 310, may include forming at least one electronic component of the following group of electronic components: a resistor, a capacitor, an inductor, a transistor (for example, a field effect transistor (FET) (e.g. a metal oxide semiconductor field effect transistor (MOSFET), a fin field effect transistor (FinFET), or a floating gate transistor)), a test structure, and any other electronic component based on semiconductor technology.

Process 320 of forming the plurality of thin film batteries 104 may further include at least one of the following: a layering process, forming a mask material layer using at least a layering process, forming a hard mask, forming a soft mask, a patterning process, a lithographic process, an etch process, and other semiconductor processes, e.g. so that a battery structure 100 or an electronic structure 100 may be formed as described herein.

According to various embodiments, the (solid state electrolyte) thin film batteries of the plurality of thin film batteries 104 may be formed by applying a plurality of conformal deposition processes, e.g. using a plurality of low pressure chemical vapor deposition processes and/or a plurality of atomic layer deposition processes.

Process 320 may include forming at least one of the following types of batteries: a solid state electrolyte battery (that means a solid state battery, wherein the electrodes are provided via solid state materials and the electrolyte is a solid state material as well), a lithium-ion based battery, a solid state lithium-ion based battery, a thin film battery, a lithium-ion based thin film battery, or any other type of suitable solid state electrolyte battery, e.g. a metal hydride based thin film battery including a solid state electrolyte layer. The thin film batteries of the plurality of thin film batteries 104 formed in process 320 may include secondary batteries; in other words, the solid state electrolyte battery 104 may be a rechargeable battery.

Further, at least part of the plurality of thin film batteries 104 may be formed at the same time, e.g. by performing the necessary layering processes. Thereby, the battery layers of the battery layer stack 204 forming the batteries 104 may be formed first over the whole wafer, or over a large area of the wafer, wherein the plurality of thin film batteries 104 may be formed by patterning the initially formed battery layer stack 204.

Forming the battery layer stack 204 may include forming a lithium-ion based thin film battery layer stack, e.g. a rechargeable lithium-ion based thin film battery layer stack. The method for manufacturing a battery structure 100 or an electronic structure 100 may further include providing (or forming) a metallization structure (or a metallization layer) electrically connecting the solid state electrolyte batteries 104.

Using method 300, as described above, may allow manufacturing a monolithically integrated rechargeable battery structure 100 (a rechargeable battery structure 100 including a plurality of thin film batteries) via semiconductor technology. Method 300 may be integrated into any semiconductor technology. In general, method 300 may combine techniques and materials as used in both, forming a rechargeable battery and forming a semiconductor structure, which may result in an easy and/or cost efficient manufacturing process.

Forming one or more solid state electrolyte batteries 104 may include forming a battery layer stack 204, wherein the battery layer stack 204 may include at least one layer of the following layers: a cathode layer, an anode layer, an electrolyte layer (e.g. including a solid state electrolyte), a cathode current collector layer, an anode current collector layer, and an insulating layer (e.g. electrically separating the battery layer stack 204 from the carrier 102 and/or from the contact structure 106 and/or from the integrated circuit structure 118).

One or more (solid state electrolyte) thin film batteries 104 may be formed by using a conformal deposition process, e.g. using at least one of a low pressure chemical vapor deposition process and an atomic layer deposition process. One or more (solid state electrolyte) thin film batteries 104 may be formed by applying a plurality of conformal deposition processes, e.g. using a plurality of low pressure chemical vapor deposition processes and/or a plurality of atomic layer deposition processes.

According to various embodiments, the method 300 may further include, in process 330 (as shown in FIG. 3B), forming a contact structure 106 electrically connecting the plurality of thin film batteries 104 with each other; wherein at least two thin film batteries of the plurality of thin film batteries 104 may be electrically coupled in series or in parallel.

In general, the plurality of thin film batteries may be integrated into a single semiconductor carrier, e.g. into a silicon chip or into a silicon wafer. Thereby, the wiring of the plurality of thin film batteries 104 may be controlled by an integrated circuit structure 118 being formed over the same wafer or communicating with the plurality of thin film batteries 104.

Various modifications and/or configurations of the electronic structure 100 and/or the battery structure 100 and details referring to the plurality of thin film batteries 104, the contact structure 106, and the integrated circuit structure 118 are described in the following, wherein the features and/or functionalities described referring to FIGS. 1A to 1F, FIGS. 2A and 2B, and FIGS. 3A and 3B may be included analogously. Further, the features and/or functionalities described in the following may be included in the electronic structure 100 and/or in the battery structure 100 or may be combined with the electronic structure 100 and/or with the battery structure 100, as described before referring to FIGS. 1A to 1F, FIGS. 2A and 2B, and FIGS. 3A and 3B.

In general, for different applications, rechargeable batteries with different output voltages, output currents and/or charge capacities may be required, wherein commonly used rechargeable batteries being integrated on a chip are in general only able to deliver one fixed specific output voltage value, output current value and/or charge capacity value. Further, the charging of a single cell thin film battery having a large charge capacity may be very time consuming (e.g. may take hours).

According to various embodiments, the battery structure 100 and/or the electronic structure 100 described herein may be formed in semiconductor technology. A plurality of battery layer stacks 204 may be deposited as a two-dimensional sheet or within three-dimensional structures, i.e. within trenches. Each of this layer stacks may be contacted for example separately by conventional mid of line processes. The single battery layer stacks may be connected by one wiring layer or by multiple wiring layers. The design of the wiring 106 may allow a customer specific selection of current, voltage and capacity both for the use of the battery structure 100 or the electronic structure 100 and its charge process. The electronic structure 100 and/or the battery structure 100 may include a plurality of three-dimensional batteries and/or a plurality of two-dimensional batteries on a chip or on a wafer.

According to various embodiments, each single battery layer stack 204 of the plurality of thin film batteries 104 may be electrically contacted separately, which may enable a customer specific choice for I (the current), U (the voltage) and C (the capacity) of the electronic structure 100 or of the battery structure 100 (the battery chip 100), e.g. without changing the underlying battery arrangement. Further, the charge process of the battery layer stacks 204 of the plurality of thin film batteries 104 may be optimized using the wiring 106 (the contact structure 106). It may become less time consuming if all the batteries or at least some of the batteries may be charged in parallel.

According to various embodiments, the battery structure 100 and/or the electronic structure 100 described herein may allow an independent contacting and wiring of single thin film batteries of a plurality of thin film batteries formed on a chip or a wafer with a middle of line process. Therefore, a serial or parallel circuit design may be realized in the contact structure 106 (a metallization layer structure).

FIG. 4A to FIG. 4H respectively show a carrier 102 during the manufacturing of an electronic structure 100 or during the manufacturing of a battery structure 100 in a schematic view, according to various embodiments.

Figure 4A:
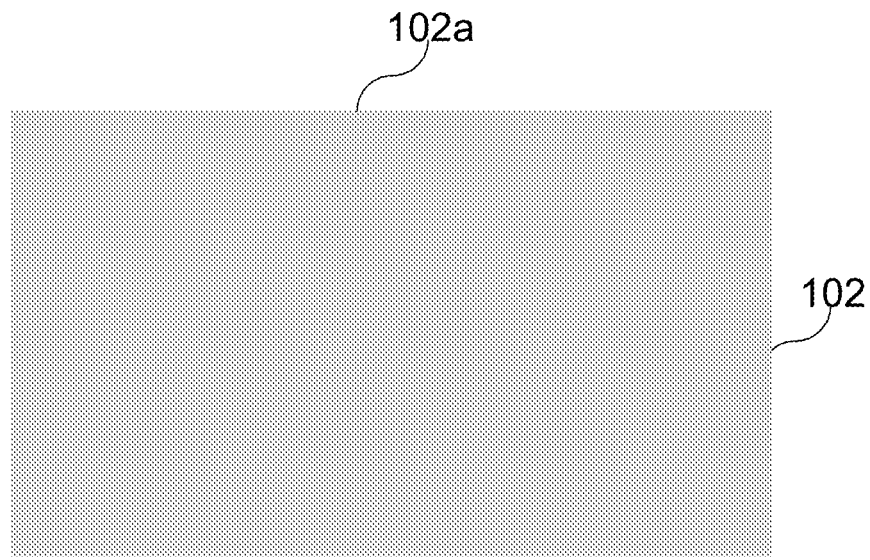
FIGS. 4A to 4H show respectively an electronic structure or a battery structure during manufacture in a schematic cross sectional view or side view, according to various embodiments.

FIG. 4A shows a carrier 102 at an initial processing stage; the carrier 102 may have a main processing surface 102a. The carrier may be configured as already described, e.g. the carrier may be a silicon wafer, a silicon bare chip, a bare die, or the carrier may include a readily processed integrated circuit. According to various embodiments, in the case that the carrier 102 may include a readily processed integrated circuit, the carrier 102 may include carrier contacts to provide an interface to the plurality of thin film batteries 104. According to various embodiments, the materials included in the carrier 102, e.g. Al/Cu or Co, may limit the subsequently performed processes in temperature, e.g. to temperatures smaller than about 400° C. In contrast, if for example tungsten may be utilized to realize the electrical connections in the carrier, the subsequently performed processes may be performed at higher temperatures than about 400° C.

Figure 4B:
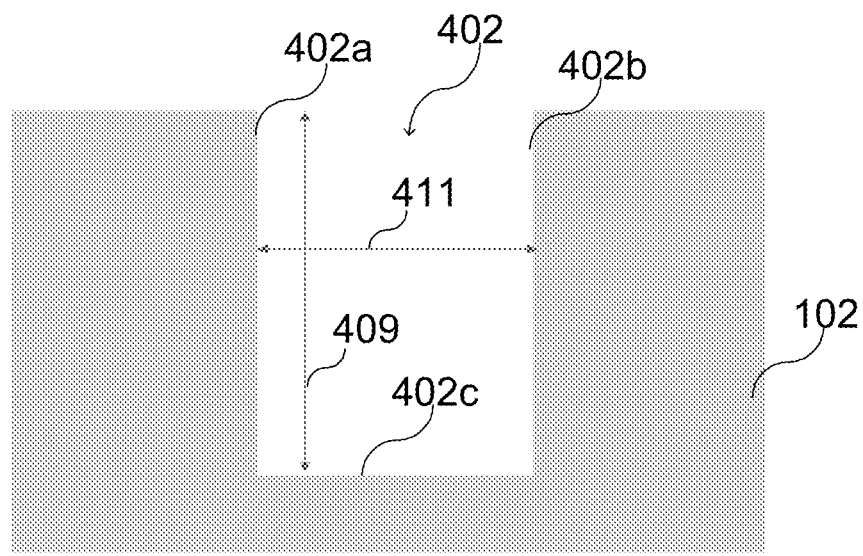

As shown in FIG. 4B, one or more recesses 402 (trenches or cavities) may be formed at least one of over an in the carrier 102. Alternatively, a plurality of structure elements may be formed at least one of over an in the carrier 102a providing a recesses structure 402. According to various embodiments, the depth 409 of the one or more recesses 402 may be limited due to the etch process or due to the wafer thickness. According to various embodiments, the width 411 of the one or more recesses 402 may be in the range from about several tens of nanometers to about several hundreds of micrometers or even larger. The width 411 of the one or more recesses 402 may be in the range from about 50 nm to about 200 nm. The depth 409 of the one or more recesses 402 may be in the range from about 100 nm to about 2000 nm. According to various embodiments, the one or more recesses 402 may have an aspect ratio of up to 20, or even larger, e.g. up to 50.

According to various embodiments, the one or more recesses 402 may be formed by utilizing an etch process. In other words, the one or more recesses 402 may be formed by patterning the surface region of the carrier 102. Further, the carrier 102 may include a surface region, wherein the surface region may include an oxide, e.g. silicon oxide. In this case, the one or more recesses 402 may be formed by using an oxide etch process.

Figure 4C:
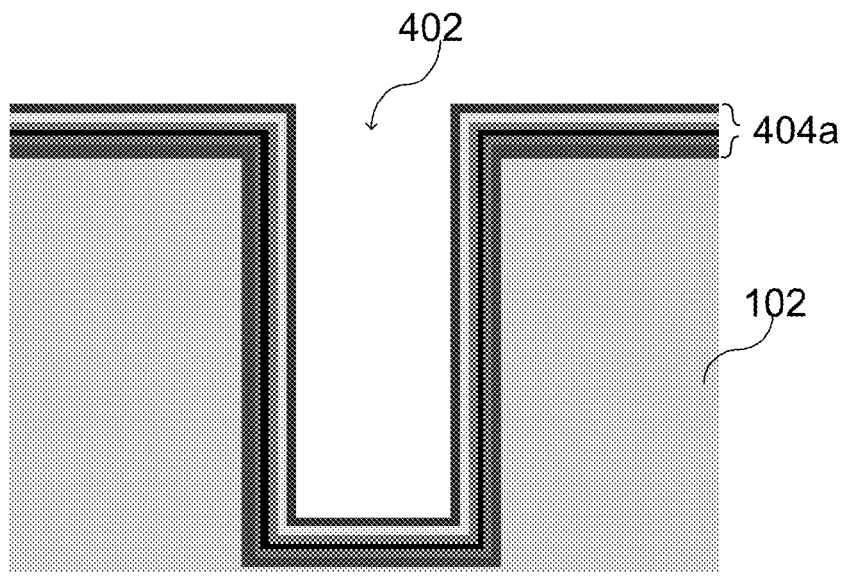

Subsequently, as shown in FIG. 4C, a first battery layer stack 404a may be formed over the carrier 102, over the main processing surface 102a of the carrier 102 and/or over the one or more recesses 402. Thereby, a first battery layer stack 404a may be deposited conformally over the carrier 102, e.g. using ALD and/or LPCVD processes.

The first battery layer stack 404a may be configured as described referring to the battery layer stack 204 described before, e.g. referring to FIGS. 2A and 2B. According to various embodiments, the solid state electrolyte layer may include LiPON and/or another solid state electrolyte material, as already described. The solid state electrolyte layer may have a thickness of about several 10 nm, or a thickness as already described. Further, the anode layer adjoining the solid state electrolyte layer may include silicon (e.g. amorphous silicon, and/or another anode material, e.g. an optional carbon layer (e.g. including pyrolytic carbon), as already described. The anode layer may have a thickness in the range from about 30 nm to about 50 nm, or a thickness as already described. Further, the cathode layer adjoining the solid state electrolyte layer may include $LiCoO_2$ and/or another cathode material, as already described. The cathode layer may have a thickness of about several 10 nm, or a thickness as already described. The anode current collector layer adjoining the anode layer may include TiN (e.g. functioning as current collector and diffusion barrier layer at the same time) and/or another current collector material, as already described. The anode current collector layer may have a thickness of about 20 nm, or a thickness as already described. The cathode current collector layer adjoining the cathode layer may include TiN (e.g. functioning as current collector and diffusion barrier layer at the same time), and/or another current collector material, e.g. platinum, as already described. The cathode current collector layer may have a thickness of about several 10 nm, or a thickness as already described.

Figure 4D:
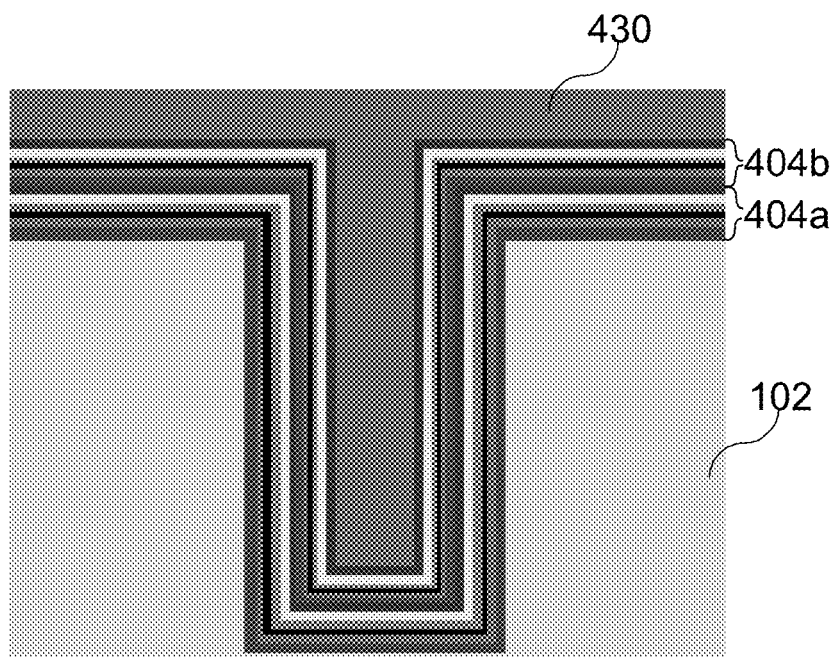

Optionally, as for example schematically illustrated in FIG. 4D, one additional battery layer stack 404b (or more than one additional battery layer stacks 404b) may be formed over the first battery layer stack 404a. The one or more additional battery layer stacks 404b being formed over the first battery layer stack 404a may have the same properties and the same features as described before for the first battery layer stack 404a. Illustratively, the first battery layer stack 404a may be formed m times over the carrier 102. Thereby, as already described, the m battery layer stacks 404a, 404b may form one thin film battery 104a, 104b, 104c, or the battery layer stacks 404a, 404b may provide the plurality of thin film batteries 104.

Further, the one or more battery layer stacks 404a, 404b may be covered with a dielectric material (e.g. with silicon oxide), so that for example a remaining recess may be filled up with the dielectric material. According to various embodiments, the one or more battery layer stacks 404a, 404b may be covered with a semiconducting or electrically conductive material (e.g. with silicon, doped silicon, and the like), so that for example a remaining recess may be filled up with the semiconducting or electrically conductive material.

Figure 4E:
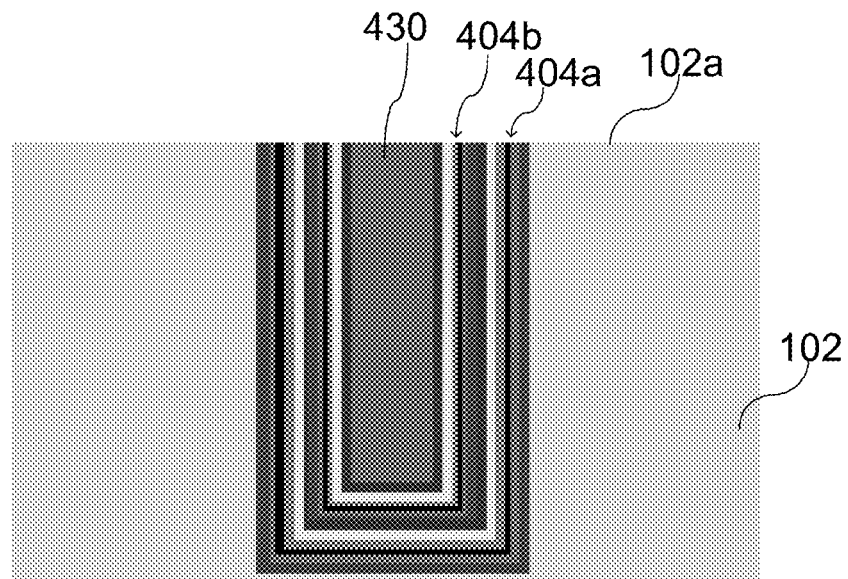

As schematically illustrated in FIG. 4E, a chemical mechanical polishing (CMP) process may be carried out exposing the surface 102a of the carrier next to the one or more recesses 402. In other words, the CMP process may be carried out down to the carrier 102.

Figure 4F:
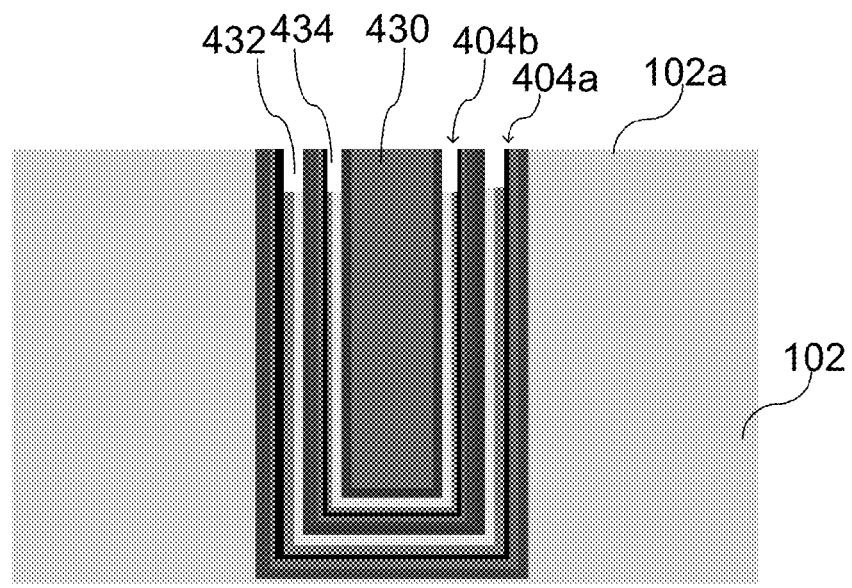

Subsequently, as schematically illustrated in FIG. 4F, an etch process (e.g. a wet etching) may be carried out removing the solid state electrolyte layers and/or the cathode layers from the one or more battery layer stacks 404a, 404b partially. Thereby, one or more recesses 432, 434 may be formed in the battery layer stacks 404a, 404b. This may allow an easier and/or more precise electrically contacting of the one or more battery layer stacks 404a, 404b.

Figure 4G:
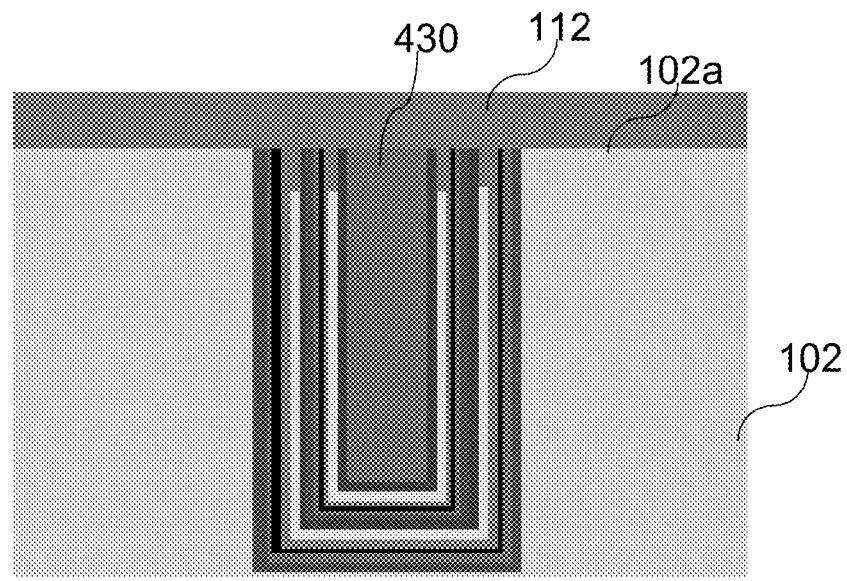

Subsequently, as schematically illustrated in FIG. 4G, the one or more battery layer stacks 404a, 404b and at least partially the carrier 102 may be covered with a dielectric material (e.g. with silicon oxide), so that for example the recesses 432, 434 in the battery layer stacks 404a, 404b may be filled up with the dielectric material. The dielectric layer 112 being formed over the one or more battery layer stacks 404a, 404b and at least partially over the carrier 102 may provide a part of the contact structure 106 (the metallization 106), e.g. the mold material for the contact structure 106.

Figure 4H:
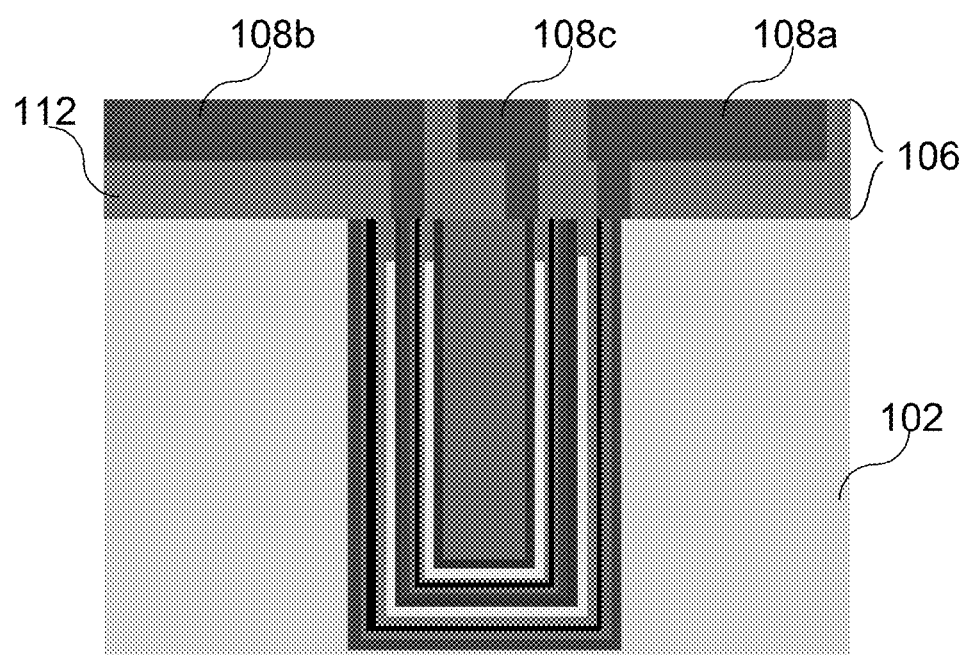

Subsequently, as schematically illustrated in FIG. 4H, a wiring 110 or a wiring structure (the complete contact structure 106) may be formed, e.g. by patterning the dielectric layer 112 and forming the metal lines, vias and/or contact pads 108a, 108b, 108c of the metallization 106 (the contact structure 106), as already described.

According to various embodiments, the battery layer stacks 404a, 404b may be connected in series, so that different voltages may be provided at the contact pads 108a, 108b, 108c of the contact structure 106, as already described.

Figure 5A:
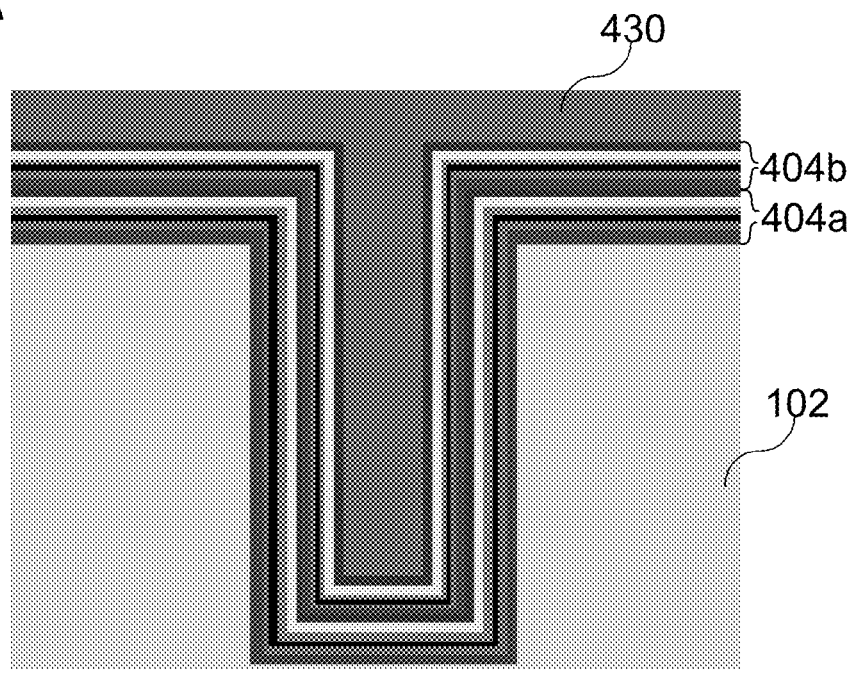
FIGS. 5A to 5G show respectively an electronic structure or a battery structure during manufacture in a schematic cross sectional view or side view, according to various embodiments.

In the following FIGS. 5A to 5G an alternative is illustrated for electrically contacting the one or more battery layer stacks 404a, 404b, starting from the processed carrier 102 as illustrated in FIG. 4D, which is shown in FIG. 5A again.

Figure 5B:
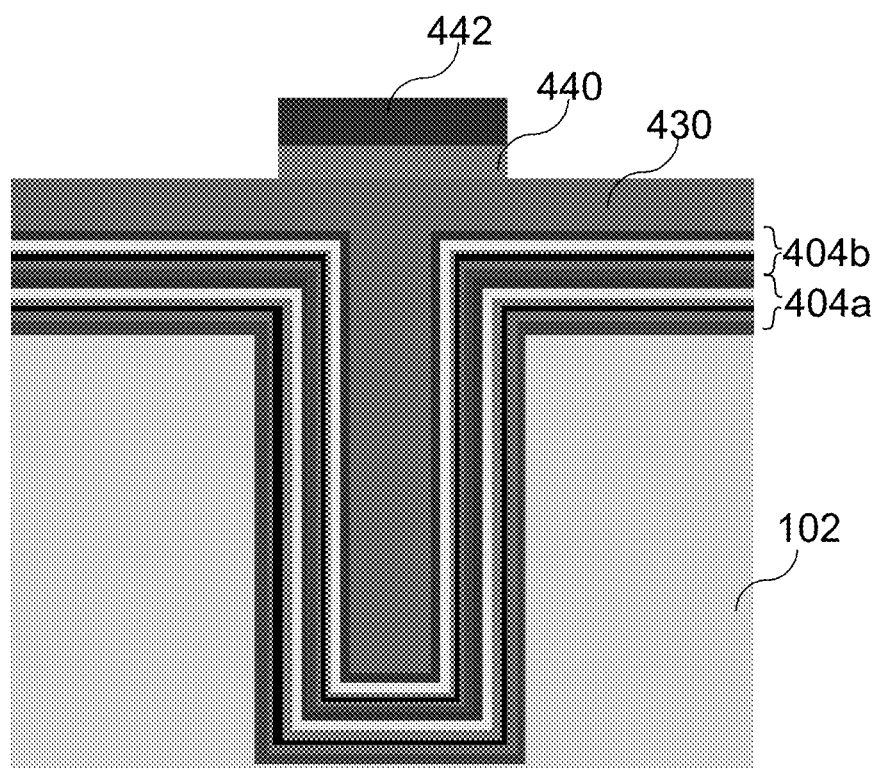

As schematically illustrated in FIG. 5B, for patterning the battery layer stacks 404a, 404b a first patterned hard mask 440 may be formed over the battery layer stacks 404a, 404b being formed within or over the recess 402. The first patterned hard mask 440 may be formed by depositing a hard mask material layer and patterning the hard mask material layer using for example a lithographic patterning process (e.g. applying a resist, patterning the resist, and removing the hard mask layer partially).

Figure 5C:
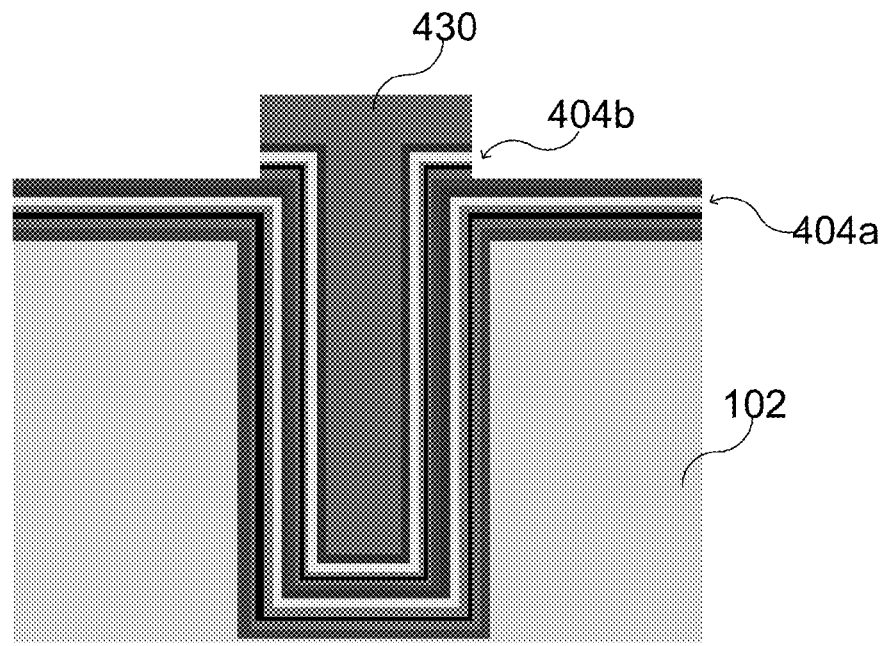

Subsequently, as schematically illustrated in FIG. 5C, defined by the first patterned hard mask 440, the second battery layer stack 404b may be removed partially, e.g. using an etch process (e.g. reactive ion etching, dry etching, or a combination thereof). Further, the hard mask may be removed as well as the remaining resist 442 above the first patterned hard mask 440, e.g. using a selective etch process. According to various embodiments, after the second battery layer stack 404b has been partially removed, the current collector layer 114b may be exposed. The exposed current collector layer 114b may serve as a second terminal of the first battery layer stack 404a and as first terminal of the second battery layer stack 404b, similar as already described referring to FIGS. 1A to 1F.

Figure 5D:
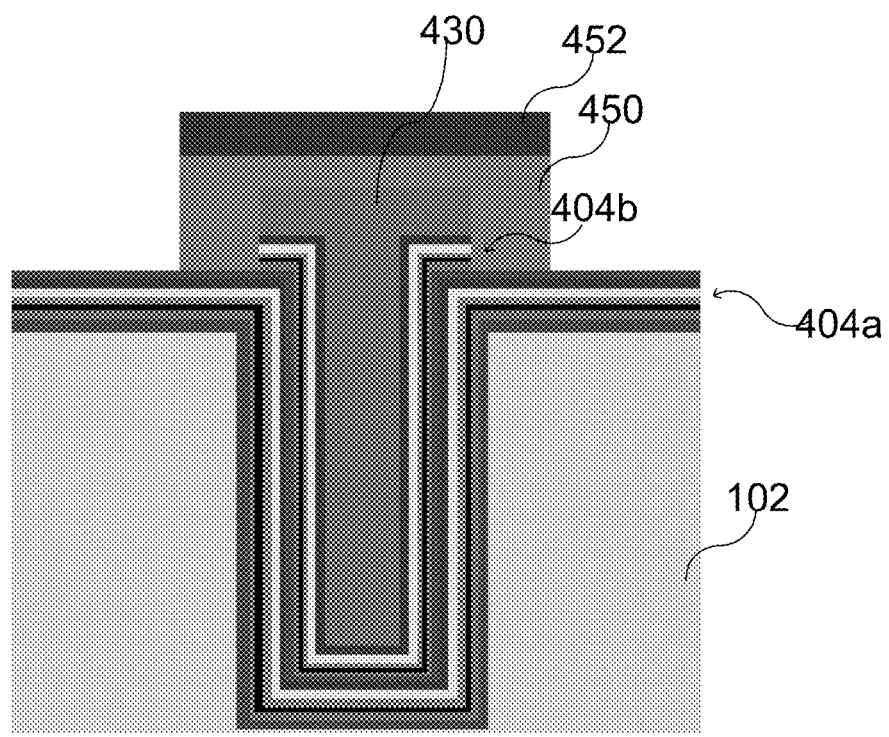

Subsequently, as schematically illustrated in FIG. 5D, a second patterned hard mask 450 may be formed over the partially removed second battery layer stack 404b for patterning the first battery layer stack 404a. The second patterned hard mask 450 may be formed by depositing a hard mask material layer (e.g. silicon nitride) and patterning the hard mask material layer using for example a lithographic patterning process (e.g. applying a resist, patterning the resist, and partially removing the hard mask layer using an etch process).

Figure 5E:
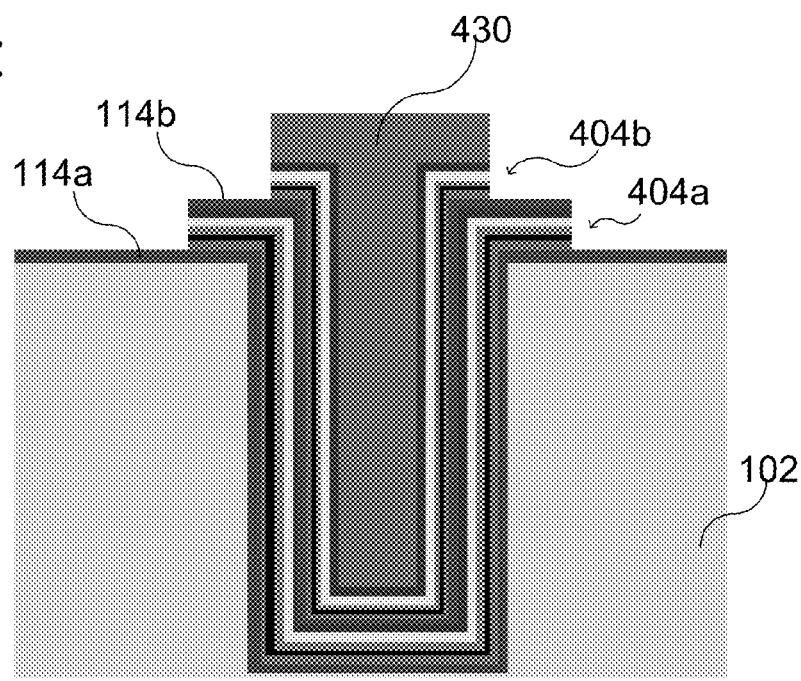

Subsequently, as schematically illustrated in FIG. 5E, defined by the second patterned hard mask 450, the first battery layer stack 404a may be removed partially, e.g. using an etch process (e.g. reactive ion etching, dry etching, or a combination thereof). Further, the second patterned hard mask 450 may be removed as well as the remaining resist 442 above the second patterned hard mask 450, e.g. using a selective etch process. According to various embodiments, after the first battery layer stack 404a has been partially removed, the current collector layer 114a may be exposed. The exposed current collector layer 114a may serve as a first terminal of the first battery layer stack 404a, as already described.

Illustratively, the patterning of the first battery layer stack 404a and the patterning of the second battery layer stack 404b may be performed in such a way, that the respective terminals 114a, 114b, 116a, 116b of the battery layer stacks 404a, 404b may be exposed. Referring to this, the exposed current collector layers of the battery layer stacks 404a, 404b may serve as terminal for the thin film batteries, similar as already described referring to FIGS. 1A to 1F. Thereby, since one current collector of the first battery layer stack 404a may be electrically connected (due to the direct contact) to one current collector of the second battery layer stack 404b, the terminals 114b, 116a may be electrically connected to each other, which means that the battery layer stacks 404a, 404b may be connected in series to each other (c.f. FIG. 1D).

Figure 5F:
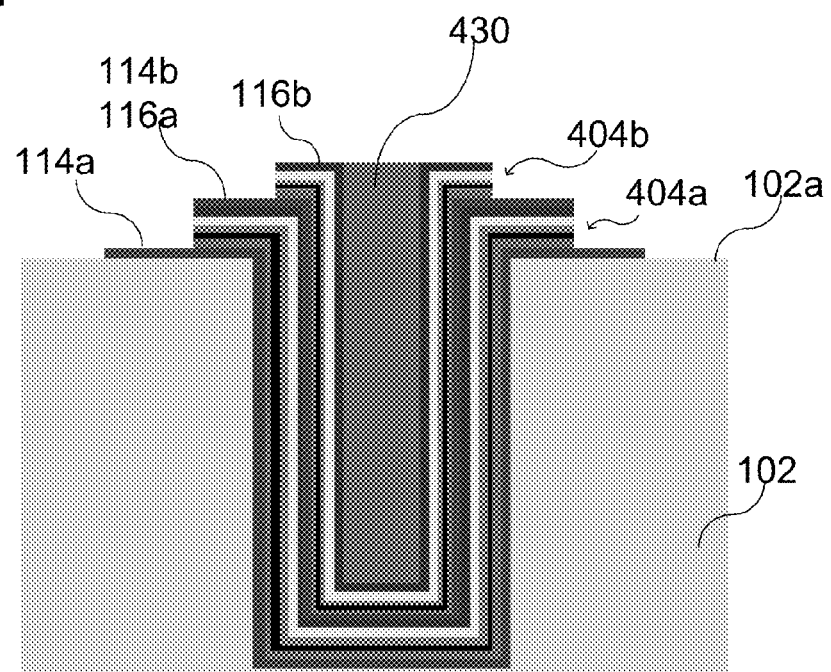

Optionally, as schematically illustrated in FIG. 5F, the material 430 being filled in the remaining recess of the battery layer stacks 404a, 404b may be partially removed to expose the second current collector layer 116b (the second terminal) of the second battery layer stack 404b. This may be for example necessary, if the material 430 may be electrically insulating or semiconducting.

Figure 5G:
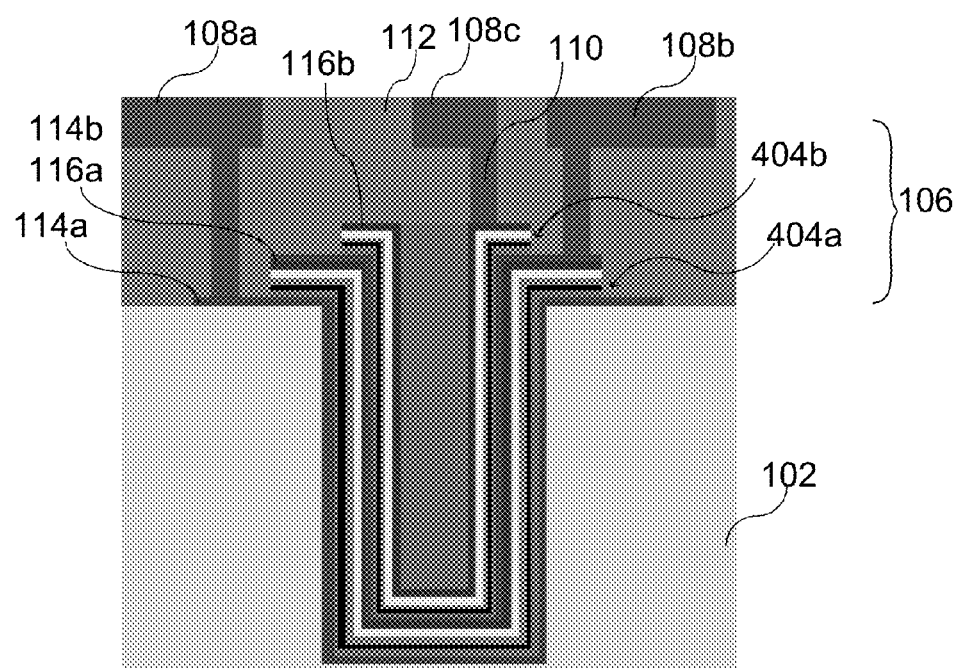

Subsequently, as schematically illustrated in FIG. 5G, a wiring 110 or a wiring structure (the contact structure 106) may be formed, e.g. by patterning a prior deposited dielectric layer 112 and forming the metal lines, vias and/or contact pads 108a, 108b, 108c of the metallization 106 (the contact structure 106), as already described.

According to various embodiments, the battery layer stacks 404a, 404b may be connected in series, such that different voltages may be provided at the contact pads 108a, 108b, 108c of the contact structure 106, as already described.

According to various embodiments, partially exposing the current collector layers of the battery layer stacks 404a, 404b may simplify the contacting of the battery layer stacks 404a, 404b, e.g. since the landing area may be increased.

Figure 6A:
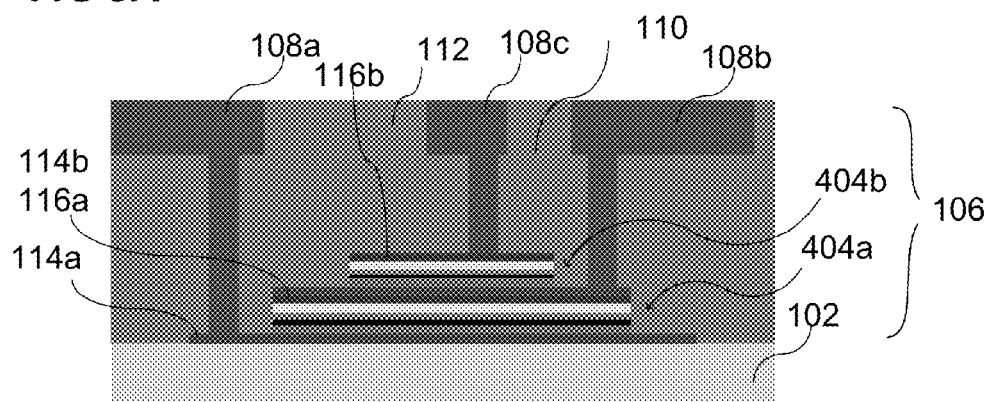
FIGS. 6A and 6B show respectively an electronic structure or a battery structure in a schematic cross sectional view or side view, according to various embodiments.
Figure 6B:
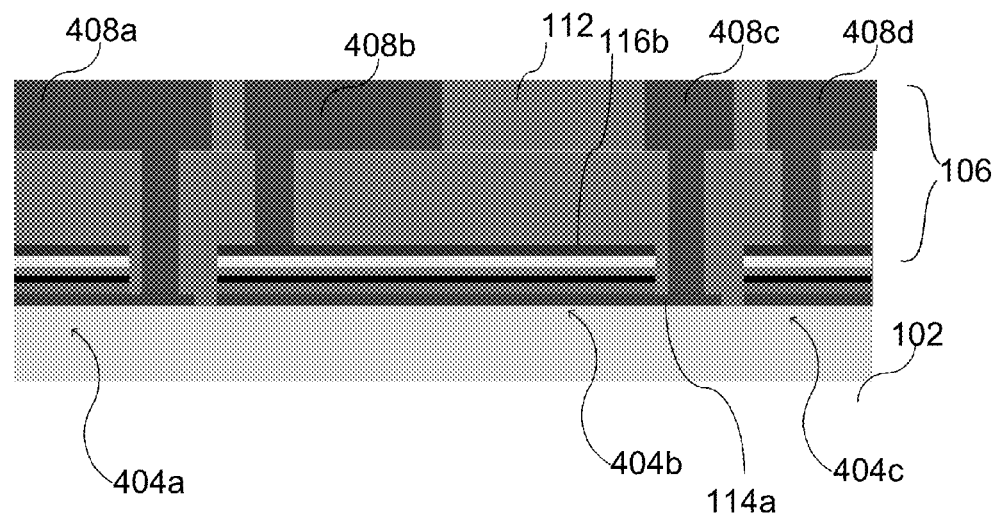

In analogy to the foregoing description, the same principle (e.g. in a similar design using similar processes) may be adapted for forming one or more planar (two-dimensional) battery layer stacks 404a, 404b, as shown in FIG. 6A and FIG. 6B.

As illustrated in FIG. 6A, according to various embodiments, the planar battery layer stacks 404a, 404b may be connected in series, as already described. Further, as illustrated in FIG. 6B, according to various embodiments, the planar battery layer stacks 404a, 404b may arranged laterally next to each other, wherein the planar battery layer stacks 404a, 404b may be individually connected to the contacts 108 of the contact structure 106, as already described.

In general, wafer costs may be an important part of the overall costs to create a battery on a chip. Therefore, the space one a wafer should be used efficiently. According to various embodiments, the capacitance of thin film batteries formed over a wafer may be enhanced, of more than one single battery layer may be formed over the wafer. Stacking for example many single battery chips one over the other may result in a higher capacity; however, the power density of this arrangement may be limited as the wafers may be only polished to values of about 100 µm to ensure their mechanical stability during the handling process in the packaging.

According to various embodiments, the battery structure 100 or the electronic structure 100 may include a plurality of thin film batteries 104 stacked over each other in different levels. Illustratively, a first thin film battery arrangement may be formed over the carrier 102, wherein afterwards an isolation material may be deposited over the first thin film battery arrangement, and wherein a second thin film battery arrangement may be formed over the first thin film battery arrangement separated from the first thin film battery arrangement by the isolation material. A thin film battery arrangement may include a plurality of thin film batteries, as described before, e.g. a three-dimensional or a two dimensional battery, with batched layers or as single layer structure.

In the following, a battery structure 100 and/or an electronic structure 100 may be provided, wherein the wafer costs per energy unit stored may be optimized, e.g. the wafer costs per energy unit stored may be reduced by the number of stacked thin film battery arrangements. The power density of a battery structure 100 including stacked thin film battery arrangements may be increased substantially linearly by the number of thin film battery arrangements formed one over the other.

Further, the chip costs per stored electrical capacity may be reduced, since the wafer to chip separation (the sawing, or dicing) costs may be incurred only once. Further, a CMOS logic or MEMS structures may be integrated on the same wafer, e.g. since the battery structure may be processed in semiconductor technology.

Figure 7A:
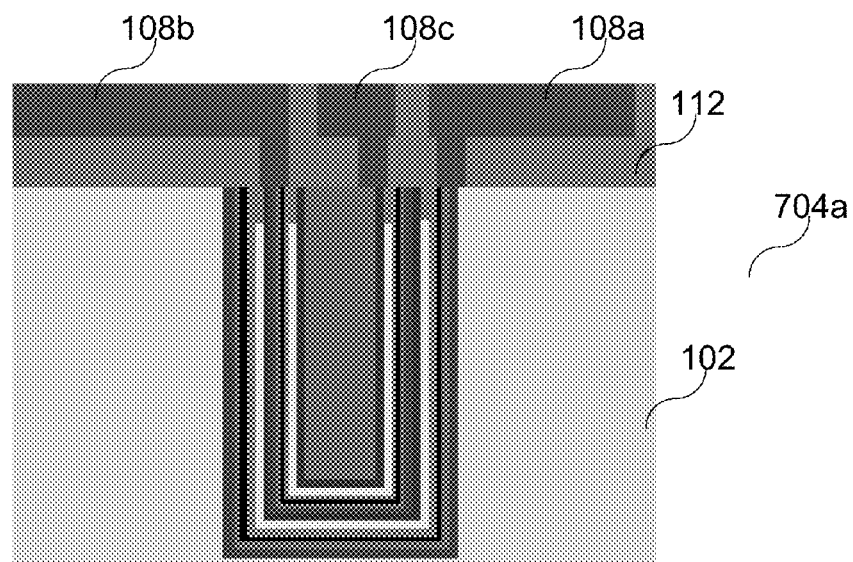
FIGS. 7A to 7D show respectively an electronic structure or a battery structure during manufacture in a schematic cross sectional view or side view, according to various embodiments.
Figure 7B:
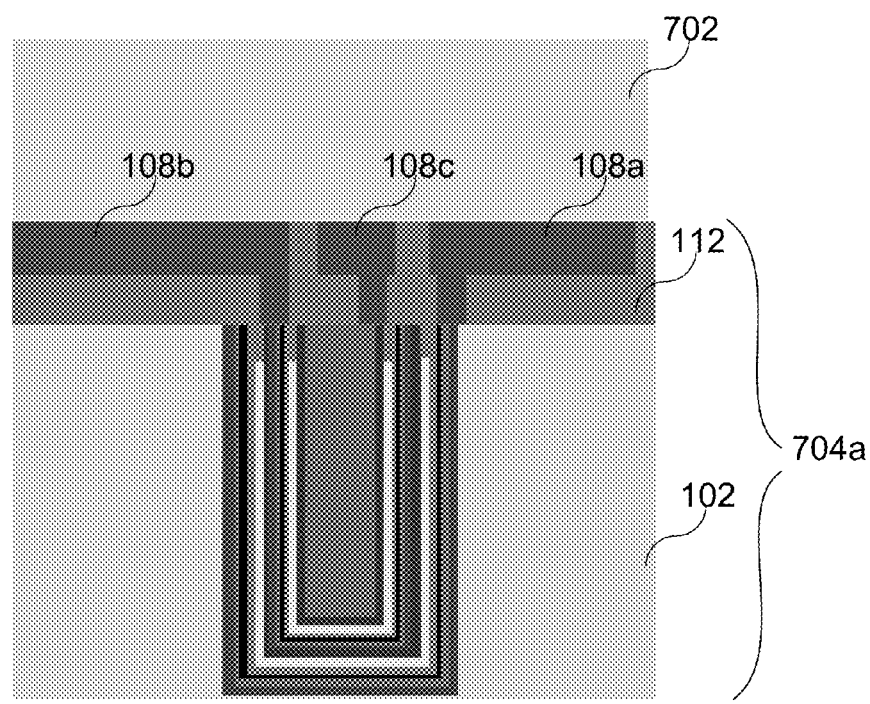

As schematically illustrated in FIG. 7A and FIG. 7B, starting from the battery structure 100 shown in FIG. 4H, a second mold material 702 (e.g. a second dielectric material layer) may be formed over a first contact structure 106 of a first thin film battery arrangement 704a. Analogously, the battery structure 100 shown in FIG. 5G, FIG. 6A, or FIG. 6B may be used as starting structure.

Figure 7C:
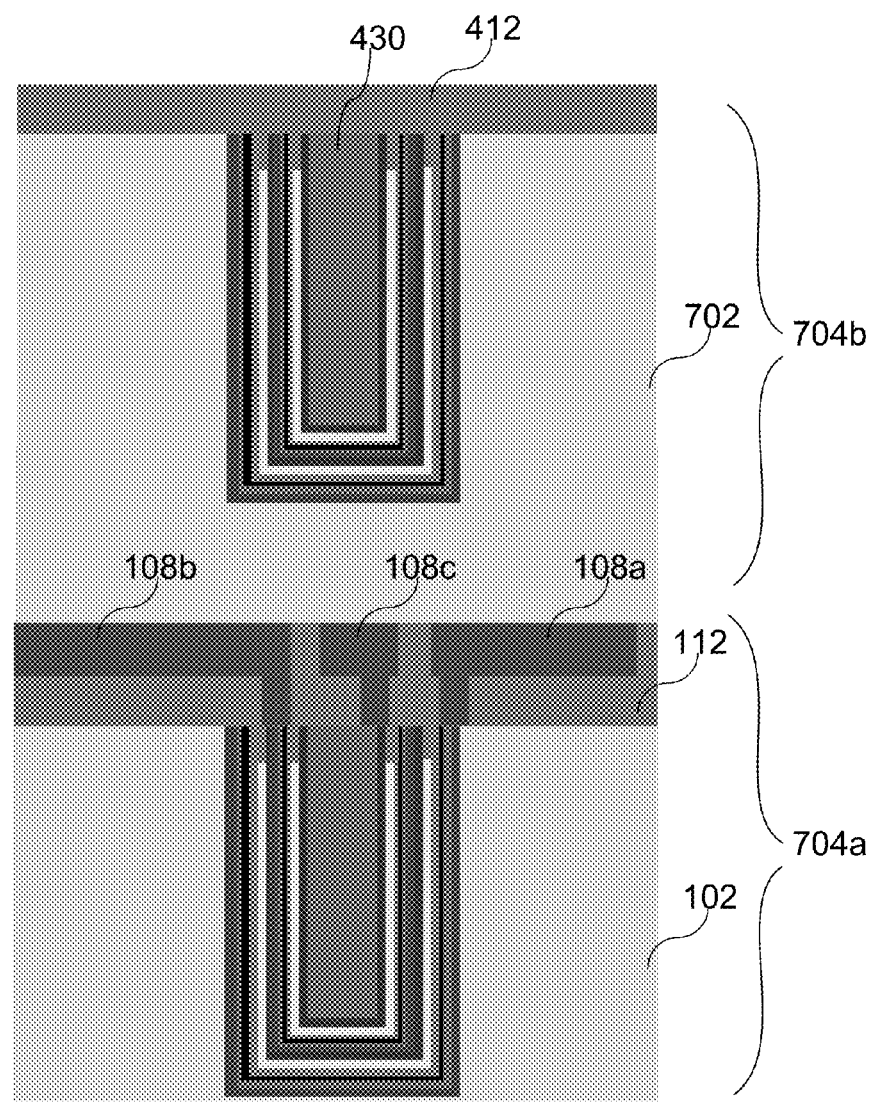

In a similar way as described referring to FIGS. 4B to 4G, a second thin film battery arrangement 704b may be formed in the second mold material 702 over the first thin film battery arrangement 704a, as schematically illustrated in FIG. 7C.

Figure 7D:
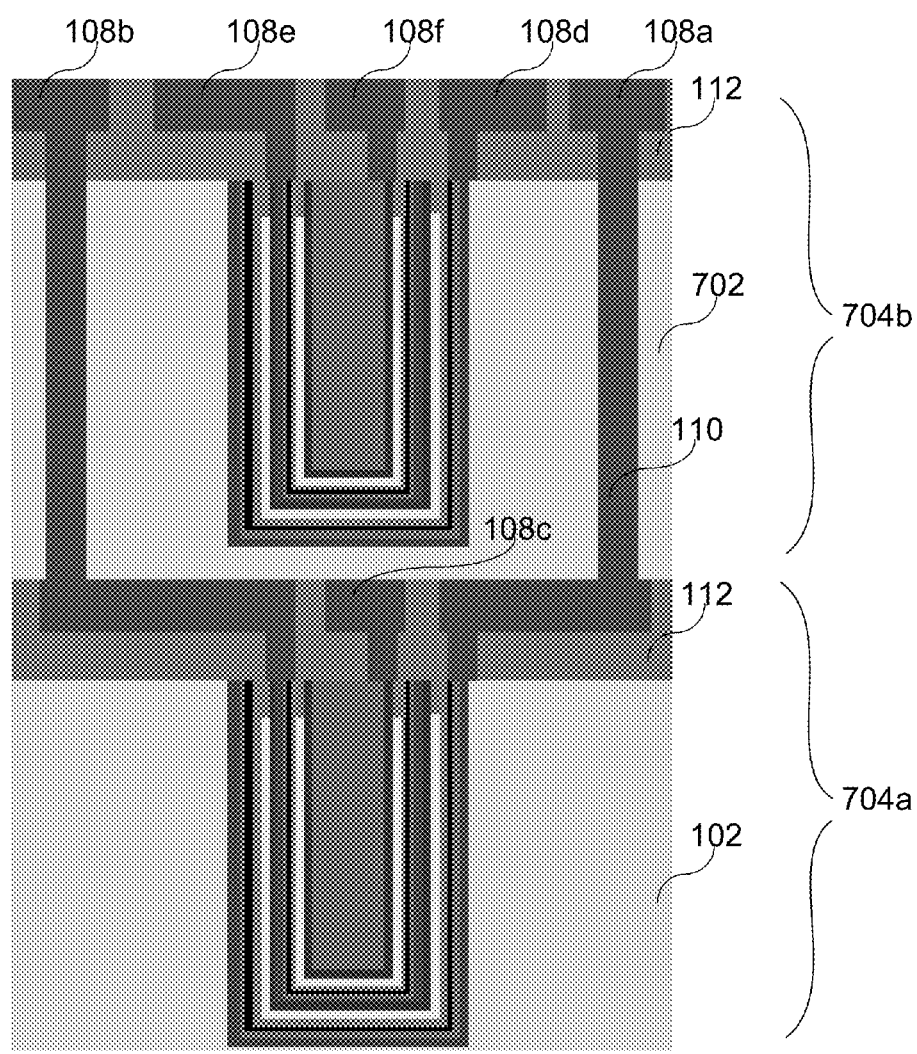

Subsequently, as schematically illustrated in FIG. 7D, the second contact structure 106 of the second thin film battery arrangement 704b may be formed such that the thin film batteries (e.g. the battery layer stacks 404a, 404b) of the first thin film battery arrangement 704a may be electrically conductively connected to the contacts of the first contact structure 106 being exposed on the upper surface of the battery structure 100.

Illustratively, the second contact structure 106 may be configured to electrically connect the battery layer stacks 404a, 404b of the first thin film battery arrangement 704a and the battery layer stacks 404a, 404b of the second thin film battery arrangement 704b.

Figure 8A:
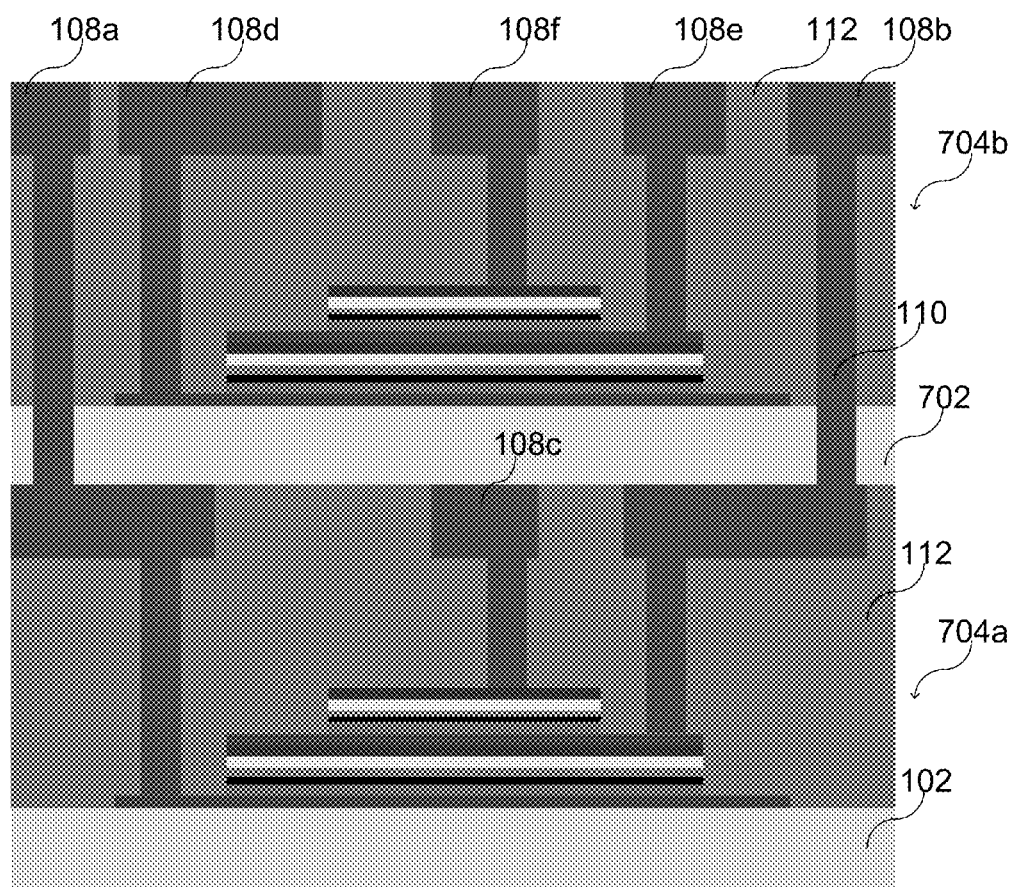
FIGS. 8A and 8B show respectively an electronic structure or a battery structure in a schematic cross sectional view or side view, according to various embodiments.
Figure 8B:
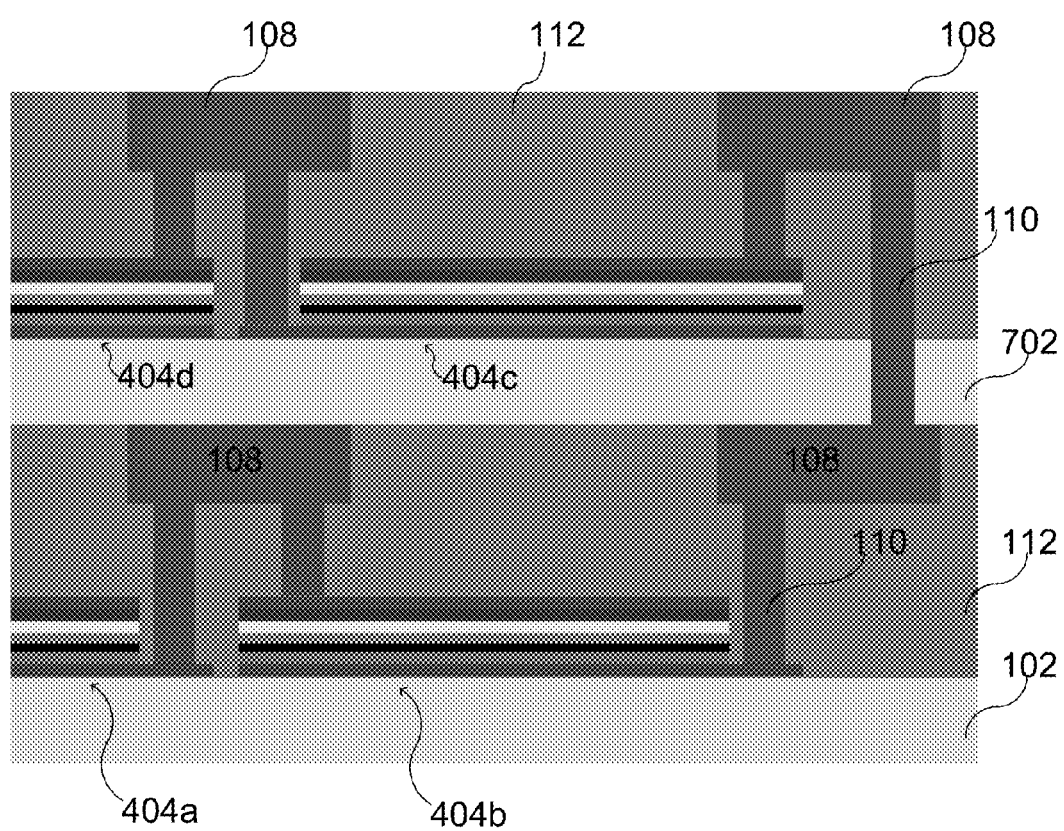

As schematically illustrated in FIG. 8A and FIG. 8B, starting from the battery structure 100 shown in FIG. 6A and FIG. 6B, a first thin film battery arrangement 704a including a plurality of planar thin film battery layer stacks 404a, 404b and a second thin film battery arrangement 704b including a plurality of planar thin film battery layer stacks 404a, 404b may be stacked over each other, as described referring to FIGS. 7A to 7D or to FIGS. 1A to 1F.

As described herein, the number of single battery cells being monolithically integrated into the carrier 102 (a single battery cell may include one cathode layer and one anode layer being separated by one solid state electrolyte layer) may be increased in three independent dimensions: firstly, a first number (m) of single battery cells may be formed over each other as a plurality of battery layer stacks being in direct contact with each other, secondly, a second number (n) of single battery cells may be formed laterally next to each other, wherein the single battery cells (e.g. the charge storing battery layers) may not be in direct contact to each other, and wherein the single battery cells may be connected via the contact structure, and thirdly, the single battery cells may be stacked over each other separated by a dielectric material, wherein the single battery cells (e.g. the charge storing battery layers) may not be in direct contact to each other, and wherein the single battery cells may be connected via the contact structure. Further, the single battery cells may have a three-dimensional structure (e.g. being formed in a recess or in a cavity), or the single battery cells may have a two-dimensional structure (e.g. being formed over a planar surface).

Figure 9:
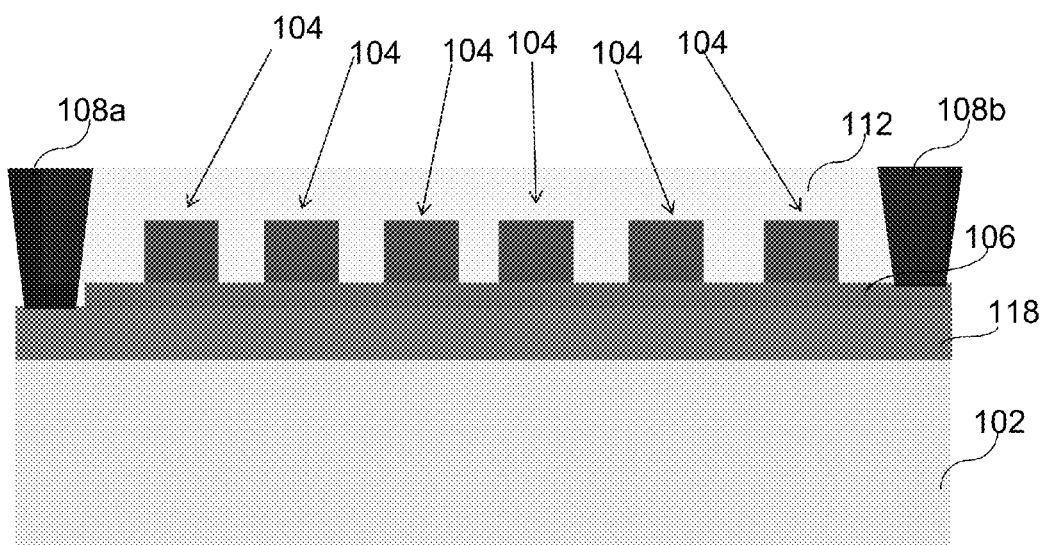
FIG. 9 shows an electronic structure or a battery structure in a schematic cross sectional view or side view, according to various embodiments.

According to various embodiments, FIG. 9 shows another modification of an electronic structure 100 or a battery structure 100, including an integrated circuit structure 118 being disposed over the carrier 102, wherein the plurality of thin film batteries 104 may be disposed over the integrated circuit structure 118. The plurality of thin film batteries 104 may be electrically connected to the integrated circuit structure 118 via the contact structure 106, wherein the contact structure 106 may be disposed for example between the plurality of thin film batteries 104 and the integrated circuit structure 118. The contact structure 106, the thin film batteries 104, the carrier 102, and the integrated circuit structure 118 may be configured as already described before or similar as described herein. According to various embodiments, the battery structure 100 may be configured such that the plurality of thin film batteries 104 may be charged in parallel via the electrical contacts 108a, 108b (or via a plurality of electrical contacts 108).

According to various embodiments, a fast charging battery structure 100 may be provided herein, as described before. In general, the time being required to recharge a battery may be of interest, e.g. while recharging an electric vehicle (EV). In this case, the recharging time for the battery may be desired to be reduced to minutes, e.g. the same time as required for a refill of a petrol driven car.

The charging time of rechargeable batteries may depend amongst others on the charge storing capacity of the battery, wherein the charge storing capacity of the battery should be high. Therefore, the charging time may be reduced by parallel charging a plurality of smaller basic cells being connected to a battery structure 100, as described herein. Referring to this, theoretically the same charging time being necessary to recharge the small basic cell can be reached for the whole battery structure 100, e.g. via parallel charging of the small basic cells.

In commonly used battery technologies reducing the size of the basic cells, while keeping the total battery pack capacity constant, may lead to unacceptable wiring and battery management efforts.

According to various embodiments, a battery structure 100 may be provided herein which may provide both, very small battery basic cells and in-situ parallel and/or serial wiring of the basic cells within the battery itself.

Further, logic functions like a battery management system (BMS) may be integrated into the battery structure 100 to enable further functions.

As described herein, according to various embodiments, combining CMOS technology with battery technology (solid state battery technology) may allow a reduction of the battery basic cell size to the µm-scale or even to the nm-scale. To realize the required charge storing capacity, the basic cells may be connected to each other with standard CMOS wiring techniques. Thereby, both, parallel and serial connections may be realized, or combinations thereof. Further, an in-time change of the parallel and/or serial connections may be realized via the integrated circuit structure 118 being able to control the connections of the basic cells.

In case of parallel connections, the time required for charging the battery structure 100 may be reduced. Thereby, the charging voltage required by the basic cells may remain small, depending on how many basic cells may be connected in series (e.g. the first number (m)). However, since the charging current may rise, the charging time will only be limited by power dissipation requirements and thus by cooling limitations and by wiring diameter limitations.

Therefore, according to various embodiments, the wiring diameter of the wiring of the contact structure 106 may be adapted to the desired electrical current to be transported. Naturally, a wiring material may be used providing the smallest energy dissipation (or heat generation), e.g. aluminum, an aluminum alloy, an aluminum/copper alloy, power copper, copper, tungsten, silver, gold, and the like.

According to various embodiments, connecting the plurality of thin film batteries of the battery structure 100 with each other in series may allow providing voltages up to about 1000 V or even higher.

According to various embodiments, connecting the plurality of thin film batteries of the battery structure 100 with each other in parallel may allow providing current flows up to about 1 A or even higher, e.g. up to 10 A.

According to various embodiments, the carrier 102 may be a silicon wafer having for example a lateral extension (a diameter) up to about 300 mm or even more than 300 mm.

According to various embodiments, the integrated circuit structure 118 (e.g. the logic CMOS) may enable at least one of the following: an integrated battery management system, a power converter to step up or down the output voltage; a programmable input/output voltage, a programmable input/output current, a programmable charging mode, an over discharge protection, an over current protection, a cell balance function, a weak cell recognition, a weak cell handling, and the like.

According to various embodiments, the electronic structure 100 and/or the battery structure 100 described herein may allow a fast charging by parallel and/or serial connection of small basic cells 104a, 104b, 104c. Parallel charging may circumvent problems occurring due to weak cells. The battery structure 100 may be integrated in any semiconductor technology. The battery structure 100 may include "smart battery functions", since the thin film battery cells may be controlled by the integrated circuit structure 118.

According to various embodiments, semiconductor patterning techniques may allow a simple and cost efficient patterning of very small basic cells. The capacity of these small basic cells may be reduced by scaling down the size of the basic cells (e.g. a basic cell may have a capacity of 1 µAh or less without reducing the charge storing density per required volume).

According to various embodiments, the small basic cells may be combined as desired to larger battery packs by wiring to supply energy to loads as required.

According to various embodiments, the battery structure 100 or the electronic structure 100 may be used in several different applications, which may require rechargeable batteries, consumer electronics, cell phones, EV, solar power accumulator, active RFID-chips, chip cards or smart cards, and the like. Further, the battery structure 100 or the electronic structure 100 may be used for example for at a least one of the following: energy harvesting, medical devices (e.g. cardiac pacemaker), autonomous systems (e.g. wireless sensors), and the like.

According to various embodiments, an electronic structure 100 (in analogy a battery structure 100) may include: a semiconductor carrier 102, and a plurality of thin film batteries 104 monolithically integrated with (into) the semiconductor carrier 102.

According to various embodiments, the electronic structure 100 (in analogy the battery structure 100) may further include: a contact structure 106 being configured to electrically connect the plurality of thin film batteries 104 with each other; wherein at least two thin film batteries 104a, 104*b* of the plurality of thin film batteries 104 may be electrically coupled to each other in series or in parallel.

According to various embodiments, the contact structure 106 may be configured to electrically connect the plurality of thin film batteries 104 with each other and to electrically connect the plurality of thin film batteries 104 to a plurality of contact pads 108.

According to various embodiments, each thin film battery of the plurality of thin film batteries 104 may include a battery layer stack 204, the battery layer stack 204 may include at least one solid state electrolyte layer.

According to various embodiments, the electrolyte layers of the plurality of thin film batteries 104 may be spatially separated from each other.

According to various embodiments, the battery layer stack 204 may further include at least one anode layer adjoining the at least one solid state electrolyte layer and at least one cathode layer adjoining the at least one solid state electrolyte layer.

According to various embodiments, the battery layer stack 204 may further include at least one anode current collector layer adjoining the at least one anode layer and at least one cathode current collector layer adjoining the at least one cathode layer.

According to various embodiments, the carrier 102 may include a semiconductor wafer. According to various embodiments, the battery structure 100 may be designed on wafer level.

According to various embodiments, the carrier may include a semiconductor chip. According to various embodiments, the battery structure 100 may be designed on chip level.

According to various embodiments, the contact structure 106 may include a metallization structure. According to various embodiments, the contact structure 106 may be processed in front end of line (FEOL) technology, in back end of line (BEOL) technology, and/or in middle of line (MOL) technology.

According to various embodiments, the electronic structure 100 (in analogy the battery structure 100) may further include an integrated circuit structure 118 arranged at least one of over and in the carrier 102, the integrated circuit structure 118 being electrically conductively coupled to the plurality of thin film batteries 104.

According to various embodiments, the integrated circuit structure 118 may be configured to selectively couple the plurality of thin film batteries 104 to each other and/or to selectively decouple the plurality of thin film batteries 104 from each other.

According to various embodiments, the integrated circuit structure 118 may be configured to control the number of thin film batteries of the plurality of thin film batteries 104 being electrically coupled to each other in parallel, thereby controlling the current characteristics and/or the recharging characteristics of the battery structure.

According to various embodiments, the integrated circuit structure may be configured as a logic circuit, e.g. a CMOS-logic.

According to various embodiments, the contact structure 106 may include a plurality of contacts 108 and a wiring structure 110, the wiring structure 110 may be embedded in a dielectric structure 112.

According to various embodiments, the plurality of contacts 108 of the contact structure 106 may include at least a first pair of contacts and a second pair of contacts, wherein the wiring structure 110 of the contact structure 106 (and or the integrated circuit structure 118) may be configured to provide a first voltage between the first pair of contacts and a second voltage between the second pair of contacts, wherein the first voltage is different form the second voltage.

According to various embodiments, the plurality of contacts 108 may include at least a third pair of contacts and a fourth pair of contacts, wherein the wiring structure 110 (and or the integrated circuit structure 118) may be configured to provide a first current flow characteristic between the third pair of contacts and a second current flow characteristic between the fourth pair of contacts, wherein the first current flow characteristic is different form the second current flow characteristic.

According to various embodiments, a battery structure 100 (in analogy an electronic structure 100) may include: a plurality of thin film batteries 104 being monolithically integrated with (into) a semiconductor carrier 102, each thin film battery of the plurality of thin film batteries 104 may include (e.g. in a battery layer stack 204) at least one solid state electrolyte layer, at least one anode layer adjoining the at least one solid state electrolyte layer and at least one cathode layer adjoining the at least one solid state electrolyte layer, a contact structure electrically connecting the thin film batteries of the plurality of thin film batteries, wherein at least two thin film batteries of the plurality of thin film batteries may be electrically coupled to the contacts and/or to each other.

According to various embodiments, the at least two thin film batteries of the plurality of thin film batteries may be electrically coupled to each other in series. According to various embodiments, the at least two thin film batteries of the plurality of thin film batteries may be electrically coupled to each other in parallel.

According to various embodiments, the battery layer stack 204 may include at least one anode current collector layer adjoining the at least one anode layer and at least one cathode current collector layer adjoining the at least one cathode layer.

According to various embodiments, the battery structure may further include: at least one anode current collector layer adjoining the at least one anode layer and at least one cathode current collector layer adjoining the at least one cathode layer.

According to various embodiments, the battery structure may further include: an integrated circuit structure 118 (e.g. an electronic circuit) being electrically coupled to the plurality of thin film batteries 104 and to the contact structure 106, wherein the integrated circuit structure 118 may be configured to selectively couple one or more thin film batteries of the plurality of thin film batteries 104 to each other and/or to selectively decouple one or more thin film batteries of the plurality of thin film batteries 104 from each other.

According to various embodiments, the integrated circuit structure 118 may be configured to control at least one of the current characteristic and the voltage characteristic of the battery structure 100 by controlling the wiring configuration of the wiring structure 110 connecting the plurality of thin film batteries 104.

According to various embodiments, the battery structure may further include: a wiring structure 110 switched in the contact structure 106, the wiring structure may include one or more switching elements, each of the one or more switching elements being configured to be controlled by the integrated circuit structure, wherein at least one switching element of the one or more switching elements may be configured to electrically isolate at least two thin film batteries of the plurality of thin film batteries from each other in a first operating state and to electrically conductively connect the at least two thin film batteries of the plurality of thin film batteries with each other in a second operating state.

According to various embodiments, a method for manufacturing an electronic structure 100 (in analogy a battery structure 100) may include: providing a semiconductor carrier 102, and forming a battery arrangement at least one of over and in the semiconductor carrier such that the battery arrangement may be monolithically integrated with (into) the semiconductor carrier.

According to various embodiments, a method for manufacturing an electronic structure 100 (in analogy a battery structure 100) may include: providing a semiconductor carrier 102, and forming a plurality of thin film batteries monolithically integrated with the semiconductor carrier.

According to various embodiments, forming a battery arrangement may include forming a plurality of thin film battery layer stacks.

According to various embodiments, a plurality of thin film batteries 104 being arranged laterally next to each other may be referred to as battery arrangement. Further, according to various embodiments, the battery structure 100 may include a plurality of battery arrangements being arranged over each other, e.g. stacked over each other. In other words, the battery structure 100 or the electronic structure 100 may include a plurality of battery arrangements being monolithically integrated in the carrier 102.

According to various embodiments, the method for manufacturing an electronic structure 100 may further include: forming a contact structure 106 electrically connecting the plurality of thin film batteries 104 with each other; wherein at least two thin film batteries of the plurality of thin film batteries may be electrically coupled in series and/or in parallel.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic structure comprising:
a semiconductor carrier comprising at least a first recess, and
a plurality of thin film batteries monolithically integrated with the semiconductor carrier, the plurality of thin film batteries comprising:
a first battery layer stack of a first thin film battery disposed at least in the first recess, and
a second battery layer stack of a second thin film battery disposed at least in the first recess and further disposed over the first battery layer stack in the first recess.

2. The electronic structure of claim 1, further comprising:
a contact structure configured to electrically connect the plurality of thin film batteries with each other; wherein at least two thin film batteries of the plurality of thin film batteries are electrically coupled in series or in parallel.

3. The electronic structure of claim 2,
wherein the contact structure comprises a metallization structure.

4. The electronic structure of claim 1,
wherein each thin film battery of the plurality of thin film batteries comprises a battery layer stack, wherein each of the battery layer stacks comprising at least one solid state electrolyte layer.

5. The electronic structure of claim 4,
wherein each of the battery layer stacks further comprises at least one anode layer adjoining the at least one solid state electrolyte layer and at least one cathode layer adjoining the at least one solid state electrolyte layer.

6. The electronic structure of claim 5,
wherein each of the battery layer stacks further comprises at least one anode current collector layer adjoining the at least one anode layer and at least one cathode current collector layer adjoining the at least one cathode layer.

7. The electronic structure of claim 1,
wherein the carrier comprises a semiconductor wafer.

8. The electronic structure of claim 1,
wherein the carrier comprises a semiconductor chip.

9. The electronic structure of claim 1, further comprising:
an integrated circuit structure arranged at least one of over and in the carrier, the integrated circuit structure being electrically conductively coupled to the plurality of thin film batteries.

10. The electronic structure of claim 9,
wherein the integrated circuit structure is configured to selectively couple the plurality of thin film batteries to each other and/or to selectively decouple the plurality of thin film batteries from each other.

11. The electronic structure of claim 9,
wherein the integrated circuit structure is configured as a logic circuit.

12. A battery structure comprising:
a plurality of thin film batteries monolithically integrated with a semiconductor carrier comprising at least a first recess, the first recess comprising a sidewall portion and a bottom portion, wherein each thin film battery of the plurality of thin film batteries comprises a battery stack including at least one solid state electrolyte layer, at least one anode layer adjoining the at least one solid state electrolyte layer and at least one cathode layer adjoining the at least one solid state electrolyte layer, wherein the plurality of thin film batteries further comprise:
a first battery layer stack of a first battery disposed at least in the first recess conformally covering the bottom portion and conformally covering at least a part of the sidewall portion of the first recess, and
a second battery layer stack of a second battery disposed at least in the first recess and further disposed over the first battery layer stack in the first recess, wherein the second battery layer stack is nested inside the first battery layer stack; and
a contact structure electrically connecting the plurality of thin film batteries, wherein at least two thin film batteries of the plurality of thin film batteries are electrically coupled to the contacts and to each other.

13. The battery structure of claim 12,
wherein the at least two thin film batteries of the plurality of thin film batteries are electrically coupled to each other in series.

14. The battery structure of claim 12,
wherein the at least two thin film batteries of the plurality of thin film batteries are electrically coupled to each other in parallel.

15. The battery structure of claim 12, further comprising:
at least one anode current collector layer adjoining the at least one anode layer and at least one cathode current collector layer adjoining the at least one cathode layer.

16. The battery structure of claim 12, further comprising:
an integrated circuit structure being electrically coupled to the plurality of thin film batteries and to the contact structure, wherein the integrated circuit structure is configured to selectively couple one or more thin film batteries of the plurality of thin film batteries to each other and/or to selectively decouple one or more thin film batteries of the plurality of thin film batteries from each other.

17. The battery structure of claim 16, further comprising:
a wiring structure switched in the contact structure, the wiring structure comprising one or more switching elements, each of the one or more switching elements being configured to be controlled by the integrated circuit structure, wherein at least one switching element of the one or more switching elements is configured to electrically isolate at least two thin film batteries of the plurality of thin film batteries from each other in a first operating state and to electrically conductively connect the at least two thin film batteries of the plurality of thin film batteries with each other in a second operating state.

18. A method for manufacturing an electronic structure, the method comprising:
providing a semiconductor carrier comprising at least a first recess, the recess comprising a sidewall portion and a bottom portion, and
forming a plurality of thin film batteries monolithically integrated with the semiconductor carrier so that the plurality of thin film batteries comprises forming a plurality of thin film battery layer stacks, the plurality of thin film battery layer stacks comprising:
a first battery layer stack disposed at least in the first recess conformally covering the bottom portion and conformally covering at least a part of the sidewall portion of the recess, and
a second battery layer stack disposed at least in the first recess and further disposed over the first battery layer stack in the first recess, wherein the second battery layer stack is nested inside the first battery layer stack.

19. The method of claim 18, further comprising:
forming a contact structure electrically connecting the plurality of thin film batteries with each other; wherein at least two thin film batteries of the plurality of thin film batteries are electrically coupled in series or in parallel.

20. An electronic structure comprising:
a semiconductor carrier comprising at least a first recess, the recess comprising a sidewall portion and a bottom portion, and
a plurality of thin film batteries monolithically integrated with the semiconductor carrier, the plurality of thin film batteries comprising:
a first battery layer stack of a first thin film battery disposed at least in the first recess conformally covering the bottom portion and conformally covering at least a part of the sidewall portion, and
a second battery layer stack of a second thin film battery disposed at least in the first recess and further disposed over the first battery layer stack in the first recess, wherein the second battery layer stack is nested inside the first battery layer stack.

\* \* \* \* \*